US012777563B2

(12) United States Patent
Kim

(10) Patent No.: US 12,777,563 B2
(45) Date of Patent: Oct. 27, 2026

(54) ELECTRIC RANGE

(71) Applicant: LG ELECTRONICS INC., Seoul (KR)

(72) Inventor: Mijung Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 1114 days.

(21) Appl. No.: 17/829,555

(22) Filed: Jun. 1, 2022

(65) Prior Publication Data

US 2022/0394826 A1 Dec. 8, 2022

(30) Foreign Application Priority Data

Jun. 8, 2021 (KR) ........................ 10-2021-0074428

(51) Int. Cl.
*H05B 6/12* (2006.01)
*F24C 15/00* (2006.01)
(Continued)

(52) U.S. Cl.
CPC ......... *H05B 6/1209* (2013.01); *F24C 15/006* (2013.01); *H05K 1/0201* (2013.01);
(Continued)

(58) Field of Classification Search
CPC ............ H05B 6/1209; H05B 2206/022; F24C 15/006; H05K 1/0201; H05K 7/20145; H05K 7/2039
(Continued)

(56) References Cited

U.S. PATENT DOCUMENTS 5,816,554 A * 10/1998 McCracken ........ E04H 12/2238 52/298
6,462,948 B1 * 10/2002 Leija .................. H05K 7/20727 174/16.3
(Continued)

FOREIGN PATENT DOCUMENTS

EP 3104665 12/2016
EP 3651550 5/2020
(Continued)

OTHER PUBLICATIONS

Korean Office Action dated Apr. 30, 2025, issued in Application No. 10-2021-0074428.
(Continued)

*Primary Examiner* — Justin C Dodson
*Assistant Examiner* — Yeong Juen Thong
(74) *Attorney, Agent, or Firm* — KED & ASSOCIATES

(57) ABSTRACT

An electric range that may include a case, a cover plate coupled to an upper end of the case and having an upper surface on which a heating target is disposed, at least one heater disposed under the cover plate and configured to heat the heating target, an upper bracket that is disposed under the at least one heater and supports the at least one heater, a base bracket that is disposed under the upper bracket and on which a printed circuit board is installed, a heat sink installed on the printed circuit board, a blower fan installed on the base bracket and configured to discharge air toward the heat sink, and an air guide that communicates with the blower fan and surrounds the heat sink to form a flow path of air which cools the heat sink.

15 Claims, 19 Drawing Sheets

(51) Int. Cl.
*H05K 1/02* (2006.01)
*H05K 7/20* (2006.01)

(52) U.S. Cl.
CPC ....... *H05K 7/20145* (2013.01); *H05K 7/2039* (2013.01); *H05B 2206/022* (2013.01)

(58) Field of Classification Search
USPC ................................ 219/620, 621, 622, 507
See application file for complete search history.

(56) References Cited

U.S. PATENT DOCUMENTS

| | | | | |
|---|---|---|---|---|
| 7,274,008 | B2 * | 9/2007 | Arnal Valero | H05B 6/1263 219/622 |
| 7,777,163 | B2 | 8/2010 | Hosoi et al. | |
| 8,156,694 | B2 * | 4/2012 | Knight, III | B66F 3/08 254/93 A |
| 8,291,866 | B2 * | 10/2012 | Cauchy | A01K 1/033 119/500 |
| 8,884,197 | B2 * | 11/2014 | Gagas | H05B 6/1263 219/622 |
| 2008/0017633 | A1 | 1/2008 | Hosoi et al. | |
| 2008/0142512 | A1 * | 6/2008 | Kim | F24C 15/101 219/757 |
| 2008/0239661 | A1 * | 10/2008 | McClellan | H05K 7/20154 361/690 |
| 2012/0162917 | A1 * | 6/2012 | Chen | H05K 7/20145 165/96 |
| 2016/0323938 | A1 | 11/2016 | Leonardi et al. | |
| 2018/0152992 | A1 | 5/2018 | Carcano et al. | |
| 2019/0293275 | A1 * | 9/2019 | Jiang | F21V 29/673 |
| 2020/0154598 | A1 | 5/2020 | Kim et al. | |

FOREIGN PATENT DOCUMENTS

| | | |
|---|---|---|
| EP | 3 996 470 | 5/2022 |
| JP | 2004-079401 | 3/2004 |
| JP | 2015-207398 | 11/2015 |
| KR | 10-0813730 | 3/2008 |
| KR | 10-1307594 | 9/2013 |
| KR | 10-2015-0137756 | 12/2015 |
| KR | 10-2020-0053119 | 5/2020 |

OTHER PUBLICATIONS

U.S. Appl. No. 17/826,471, filed May 27, 2022.
U.S. Appl. No. 17/829,555, filed Jun. 1, 2022.
European Search Report dated Oct. 26, 2022 issued in Application No. 22176022.6.
European Search Report issued in Application No. 22176066.3 dated Sep. 29, 2022.

* cited by examiner

ELECTRIC RANGE

CROSS-REFERENCE TO RELATED APPLICATION(S)

This application claims priority to and benefit of Korean Patent Application No. 10-2021-0074428 filed in Korea on Jun. 8, 2021, which is hereby incorporated by reference as when fully set forth herein.

BACKGROUND

Field

An electric range, and more specifically, an electric range having a structure which stably supports a component is disclosed herein.

2. BACKGROUND

The content described in this section provides only background information and does not constitute related art.

Cooking apparatuses for heating food or other items (hereinafter, collectively "food") using various methods are used at homes and in restaurants. Cooking apparatuses include gas ranges using gas and electric ranges using electricity. Electric ranges are mainly divided into electric ranges which operate through resistance heating methods and electric ranges which operate through induction heating methods.

An electrical resistance method is a method of heating a heating target, for example, a cooking container, such as a pot or frying pan, by applying a current to a metal resistance wire or a nonmetal heating material, such as silicon carbide, to generate heat and radiating or conducting the generated heat. An induction heating method is a method of heating a heating target formed of a metal component using an eddy current generated by a magnetic field generated around a coil by applying high frequency power to the coil.

A basic heating principle of an induction heating method is that, when a current is applied to a working coil or heating coil, heat is generated while a heating target is induction-heated, and the heating target is heated by the generated heat.

In Korean Patent Registration 10-1307594, which is hereby incorporated by reference, an electric range which operates through an induction heating method is disclosed.

An electric range may include a heating part which heats a heating target and an upper bracket which supports the heating part. In this case, structure for stably installing the heating part and the upper bracket in the electric range is required.

More particularly, even when overall shapes of electric ranges are similar, different shapes, sizes, and weights, for example, of heating parts and upper brackets may be designed. In this case, a support structure a position of which is easily changed in order to stably support the heating parts and the upper brackets having different shapes is required.

BRIEF DESCRIPTION OF THE DRAWINGS

Embodiments will be described in detail with reference to the following drawings in which like reference numerals refer to like elements, and wherein.

DETAILED DESCRIPTION

Figure 1:
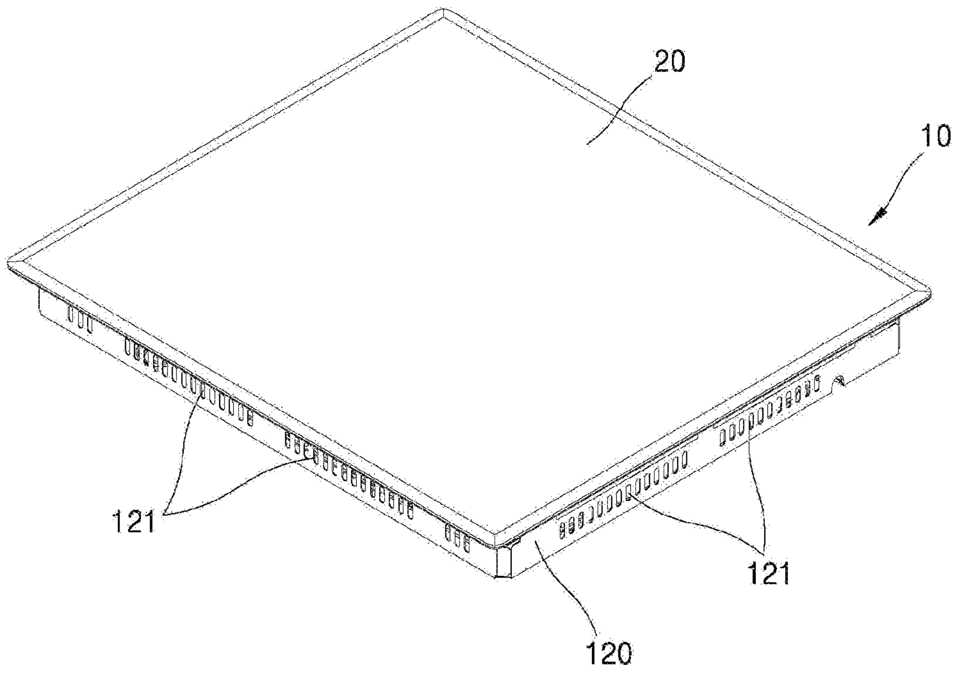
FIG. 1 is a perspective view of an electric range according to an embodiment.

Purposes, features, and advantages of embodiments will be described with reference to the accompanying drawings, and thus, the technical spirit may be easily executed by those skilled in the art. In describing embodiments, descriptions of well-known technologies related to the embodiments that unnecessarily obscure the gist will be omitted. Hereinafter, exemplary embodiments will be described with reference to the accompanying drawings. The same or similar elements are denoted by the same reference numerals in the drawings.

Although terms such as first, and second, for example, may be used for describing various elements, the elements are not limited by the terms. The terms are only used to distinguish one element from another element, and unless otherwise specifically described, a first element may also be a second element.

Throughout, unless specifically described otherwise, the number of elements may be one or a plurality.

The singular forms used in the present specification are intended to include the plural forms as well, unless the context clearly indicates otherwise. It should be interpreted that the term "comprise" or "include," when used herein, do not necessarily indicate inclusion of all components or various operations stated in the specification, and some components and operations described therewith may be omitted or further additional components and operations may be included.

Throughout, unless otherwise specifically described, "A and/or B" means "A," "B," or "A and B," and "C to D" means "more than or equal to C and less than or equal to D."

Throughout, the term "vertical direction" denotes a vertical direction of an electric range in a state in which the electric range is installed for daily use. The term "left-right direction" denotes a direction perpendicular to the "vertical direction," and the term "front-rear direction" denotes a direction perpendicular to both the "vertical direction" and the "left-right direction." The term "bilateral direction" or "lateral direction" denotes the same direction as "left-right direction," and these terms may be interchangeably used in the present specification.

Figure 2:
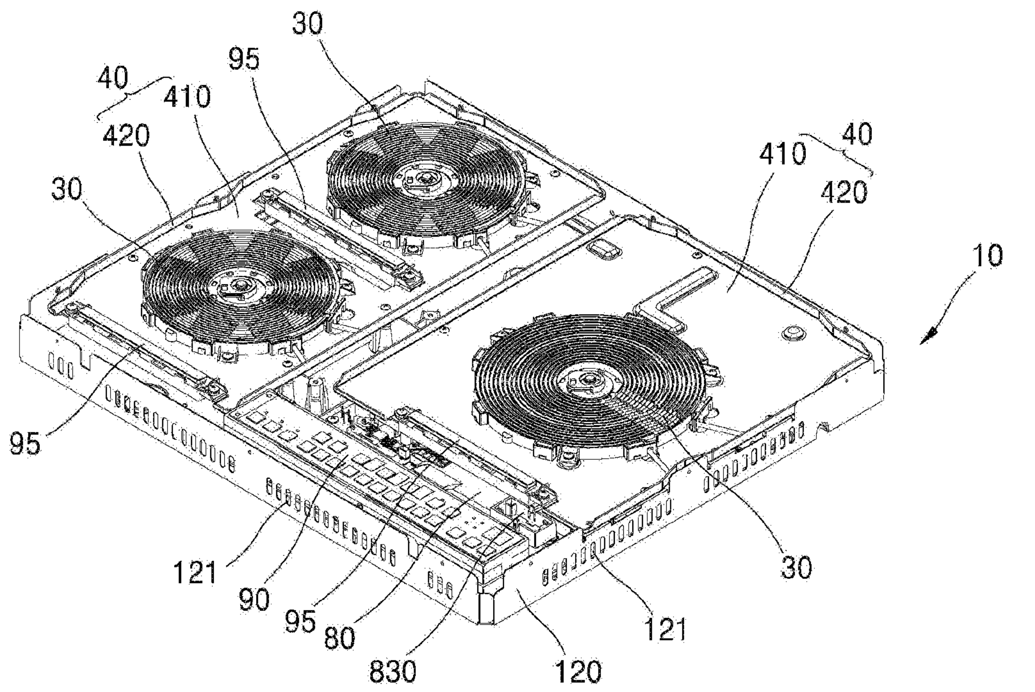
FIG. 2 is a perspective view of the electric range of FIG. 1 from which a cover plate is removed.
Figure 3:
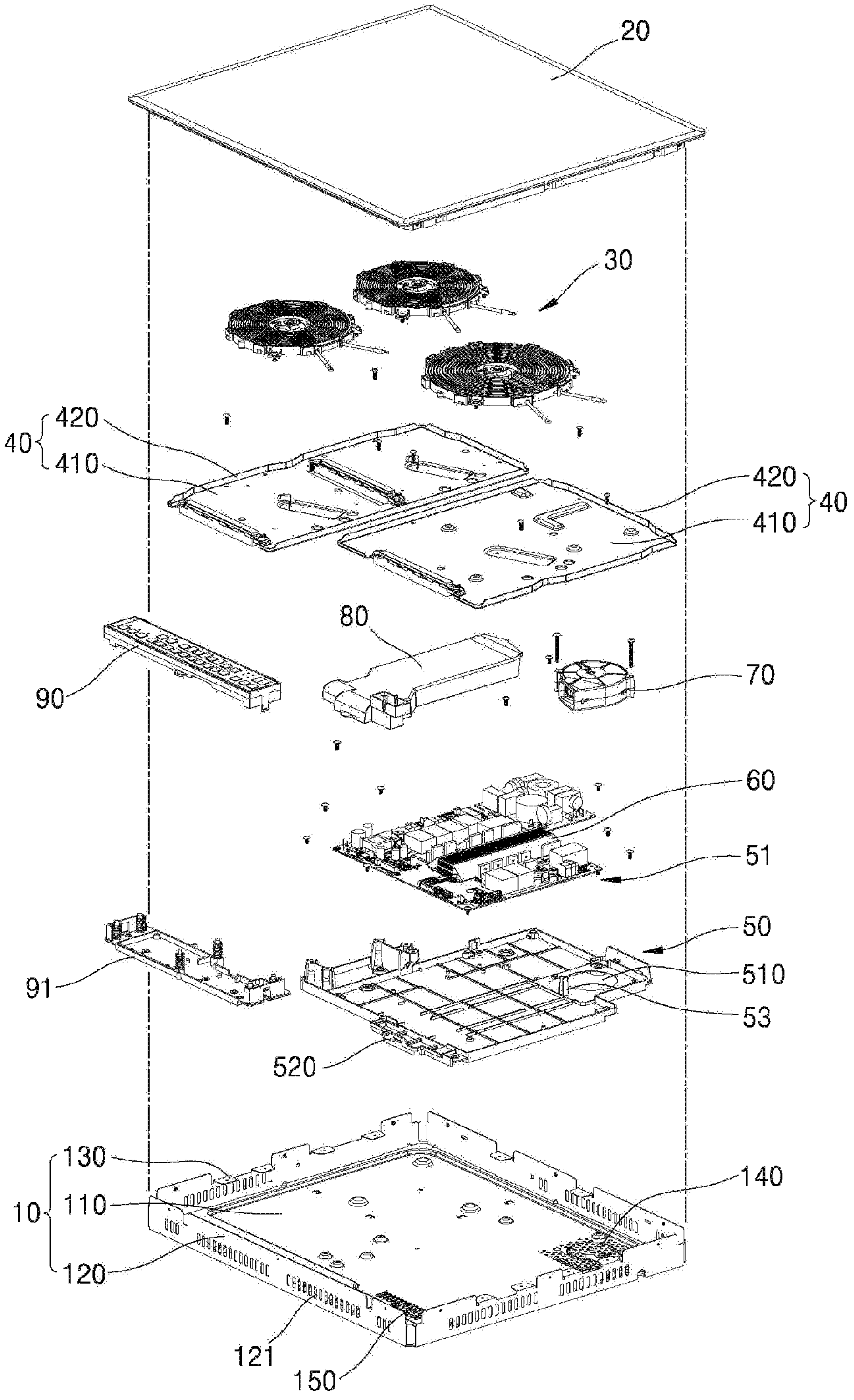
FIG. 3 is an exploded view of the electric range according to an embodiment.
Figure 4:
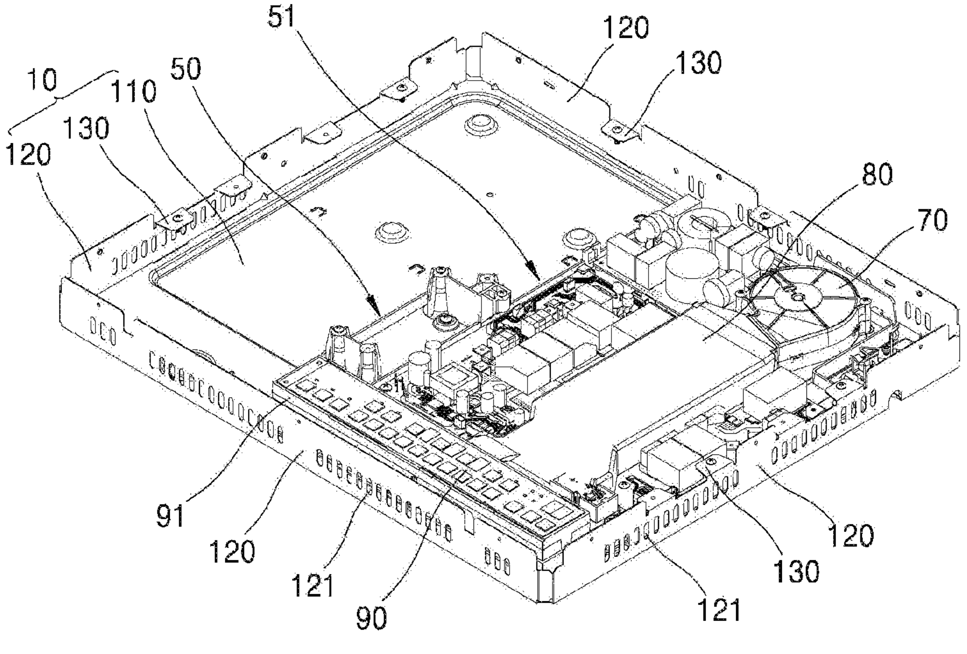
FIG. 4 is a perspective view of the electric range of FIG. 1 from which some components are removed.
Figure 5:
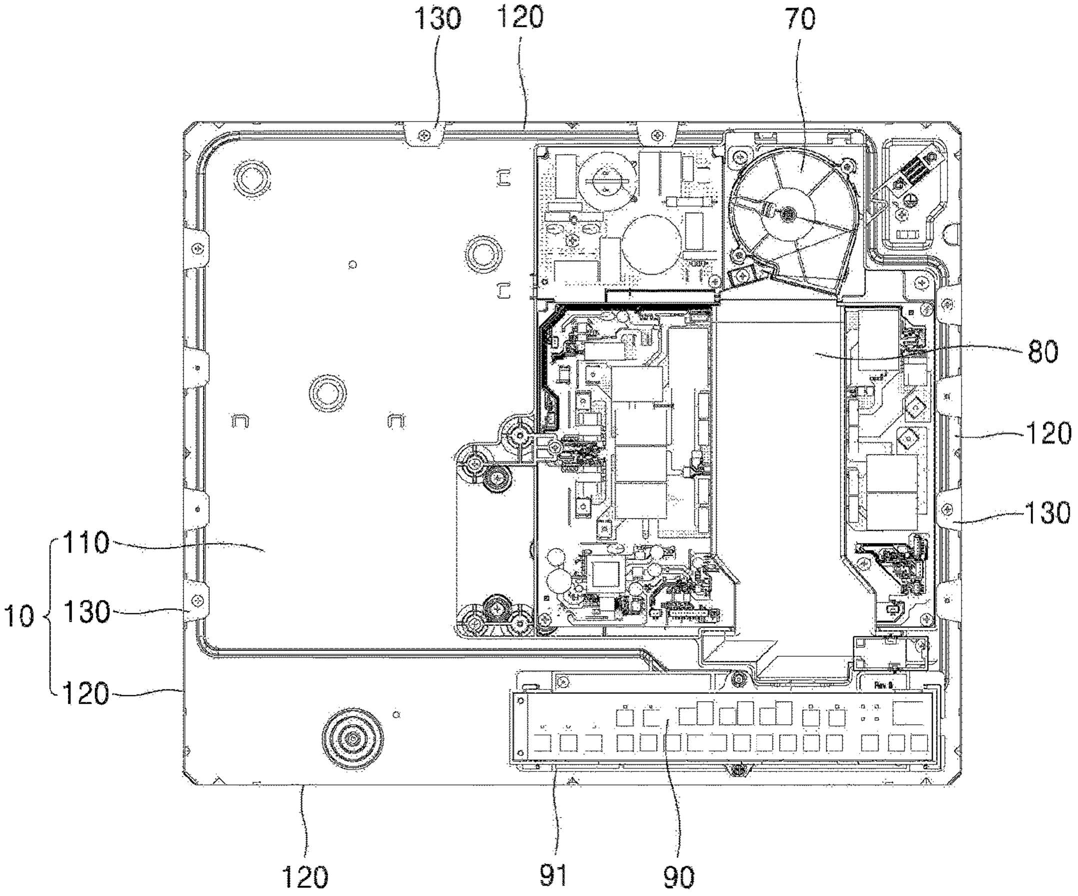
FIG. 5 is a front view of the electric range of FIG. 4.

FIG. 1 is a perspective view of an electric range according to an embodiment. FIG. 2 is a perspective view of the electric range of FIG. 1 from which a cover plate is removed. FIG. 3 is an exploded view of the electric range according to an embodiment. FIG. 4 is a perspective view of the electric range of FIG. 1 from which some components are removed. FIG. 5 is a front view of the electric range of FIG. 4.

The electric range according to an embodiment may heat a heating target using an induction heating method. In this case, the heating target may be tableware formed of a metal material, such as stainless steel or iron.

The induction heating method is a method of heating a heating target formed of a metal component using an eddy current generated by a magnetic field generated around a working coil by applying high frequency power to the working coil. That is, high frequency power is applied to a working coil of a heating part (heater) 30 having a structure in which the working coil is close to a ferrite core to generate a magnetic field around the working coil, and when a heating target is placed in a region in which the magnetic field is generated, an eddy current is induced in the heating target by the magnetic field, Joule's heat is generated by the eddy current, and the heating target may be heated. As tableware which is the heating target is heated, food contained in the heating target may be heated and cooked.

The electric range according to an embodiment may include a case 10, a cover plate 20, the heating part 30, an upper bracket 40, and a base bracket 50. The case 10 may serve to protect components constituting the electric range. For example, the case 10 may be formed of an aluminum material; however, embodiments are not limited thereto. The case 10 may be thermally insulated to suppress heat generated by the working coil of the heating part 30 from being radiated to the outside.

The components constituting the electric range, such as the heating part 30, the working coil, the upper bracket 40, and a control board 90, may be accommodated in the case 10. An upper portion of the case 10 may be open, and the open portion may be closed by the cover plate 20. The case 10 may be substantially formed in a box shape by processing a plate type material, for example.

The case 10 may include a first casing 110, a second casing 120, and a third casing 130. The first casing 110 may form a bottom surface of the case 10. The first casing 110 may support built-in components of the electric range.

In the first casing 110, at least one vent opening, through which air flows, may be provided in order to smoothly cool a printed circuit board 51 provided in an inner portion thereof and circuit elements mounted on the printed circuit board 51.

The second casing 120 may be bent from the first casing 110 and may form a side surface of the case 10. The second casing 120 may be bent from an edge of the first casing 110 in a vertical direction to form a sidewall of the electric range.

The second casing 120 may be disposed on sides of the first casing 110 formed in a substantially quadrangular shape. The second casing 120 may reinforce a strength of an entirety of the case 10. That is, the second casing 120 bent from the first casing 110 may suppress the first casing 110 having a plate shape from being warped or damaged due to a weight of the built-in components or an external force.

The second casing 120 may further include a plurality of exhaust holes 121 formed in slit shapes. The exhaust holes 121 may allow an inside and outside of the case 10 to communicate with each other so that air flows through the exhaust holes 121 to contribute to cooling of the components accommodated in the case 10.

The third casing 130 may be bent from the second casing 120 and may support the upper bracket 40. The third casing 130 may be disposed above the sides of the first casing 110.

A first upper plate 410 forming a bottom surface of the upper bracket 40 may be seated on an upper surface of the third casing 130. The first upper plate 410 and the third casing 130 may be coupled by a coupling unit, such as a bolt, for example.

The cover plate 20 may be coupled to an upper end of the case 10, and the heating target may be placed on an upper surface of the cover plate 20. The cover plate 20 may close the open upper portion of the case 10 to protect the components accommodated in the case 10.

The heating target may be placed on the upper surface of the cover plate 20, and a magnetic field generated by the heating part 30 may pass through the cover plate 20 and reach the heating target. For example, the cover plate 20 may be formed of a material containing a ceramic; however, embodiments are not limited thereto.

An input interface through which an input is received from a user may be installed on the upper surface of the cover plate 20. The input interface may be installed in a specific region of the upper surface of the cover plate 20 and may display a specific image.

A touch input may be received from the user through the input interface, and the electric range may be driven on the basis of the received touch input. For example, the input interface may be a module for a user to input a desired heating intensity or heating time and may be implemented as a physical button, or touch panel, for example. For example, the input interface may be a thin film transistor liquid crystal display (TFT LCD); however, embodiments are not limited thereto.

The control board 90 which inputs an operation command to the electric range may be provided under the cover plate 20. A plurality of key switches may be provided on the control board 90, and the user may input a command to the control board 90 through the plurality of key switches to control operation of the electric range.

In the electric range according to an embodiment, a board support 91 may be provided to stably install the control board 90 in the case 10. The board support 91 may be installed in the case 10, and the control board 90 may be installed on the board support 91.

The board support 91 may be manufactured in a shape that allows the board support 91 to be stably installed in the case 10 and allows the control board 90 to be stably mounted on the board support 91. The board support 91 may be formed of a plastic material, which is electrically insulative and is easily injection-molded, in order to be easy to manufacture, light, and electrically insulative; however, the material is not limited thereto.

In the electric range according to an embodiment, an upper surface of the control board 90 may be provided to be pressed against a lower surface of the cover plate 20. In this case, the control board 90 may be disposed at a position corresponding to the input interface. The control board 90 and the input interface may be connected to each other in a capacitive touch input manner. Accordingly, when the user inputs a control command through the input interface, the control command may be input to the control board 90.

In addition, a display on which a drive state of the electric range is displayed may be provided in a specific region of the upper surface of the cover plate 20. A light display region may be formed in the upper surface of the cover plate 20. A light source unit 95 may be disposed under the cover plate 20, and light emitted by the light source unit 95 may be transmitted to the user through the light display region.

In this case, the light display region and the light source unit 95 may be disposed at positions corresponding to each other. When a plurality of light source units 95 is provided, light display regions equal in number to the light source units 95 may also be provided in the upper surface of the cover plate 20.

The electric range according to an embodiment may further include a cover bracket that supports the cover plate 20. An upper surface of the cover bracket may support the cover plate 20, and the cover bracket may be coupled to the second casing 120 of the case 10 by a coupling unit, such as a screw bolt, for example.

A plurality of the heating part 30 may be provided and the plurality of heating parts 30, may be disposed under the cover plate 20, and may heat the heating target. The heating part 30 may be provided to operate through an induction heating method.

According to another embodiment, some of the plurality of heating parts 30 may be provided to operate through an induction heating method, while the rest of the plurality of heating parts 30 may be provided as highlight heaters using an electric resistance heating method, and thus, an electric range may be provided as a so-called hybrid range.

Hereinafter, an electric range in which all the plurality of heating parts 30 is provided to operate through the induction heating method will be described.

The heating parts 30 may be installed on the upper bracket 40, and in this embodiment, a total of three heating parts 30 may be provided. However, the number of the heating parts 30 is not limited thereto. When the plurality of heating parts 30 is provided, the upper bracket 40 that supports the heating parts 30 may also be provided as a plurality of upper brackets 40 as necessary.

The heating part 30 may include a core frame, the working coil may be spirally wound on an upper surface of the core frame, and the ferrite core may be installed on a lower surface of the core frame. Accordingly, when high frequency power is applied to the working coil, a magnetic field may be generated around the ferrite core, and the generated magnetic field may generate an eddy current in the heating target.

The upper bracket 40 may be disposed under the heating part 30 and may support the heating part 30. In this embodiment, the upper bracket 40 may be provided as the plurality of upper brackets 40. For example, the upper bracket 40 may be formed of an aluminum material; however, embodiments are not limited thereto.

The upper bracket 40 may be manufactured as a structure that supports the heating part 30 by processing a plate metal in substantially a box shape, for example. The upper bracket 40 may include first upper plate 410 and second upper plate 420. The first upper plate 410 may form the bottom surface of the upper bracket 40, and the heating part 30 may be installed on the first upper plate 410.

The first upper plate 410 may hide the printed circuit board 51 provided thereunder in the vertical direction. When the plurality of upper brackets 40 is provided, one first upper plate 410 or a plurality of first upper plates 410 combined with each other may hide the printed circuit board 51 according to an area of the printed circuit board 51.

Due to this structure, the first upper plate 410 may serve to block an electromagnetic field and electromagnetic waves generated by the heating part 30 from reaching the printed circuit board 51 and elements mounted on the printed circuit board 51. That is, the upper bracket 40 may serve to improve the performance of electromagnetic compatibility (EMC) and electromagnetic interference (EMI) for the printed circuit board 51.

The second upper plate 420 may be bent from the first upper plate 410 in the vertical direction of the electric range. The second upper plate 420 may be bent from an edge of the first upper plate 410 in the vertical direction.

The second upper plate 420 may be disposed on sides of the first upper plate 410 formed in a substantially quadrangular shape. When the plurality of upper brackets 40 is provided, the second upper plate 420 may be provided on the sides of the first upper plate 410 excluding sides adjacent to each other of the upper brackets 40.

The second upper plate 420 may reinforce a strength of an entirety of the upper bracket 40. That is, the second upper plate 420 bent from the first upper plate 410 may suppress warping of or damage to the first upper plate 410 due to a weight of built-in components including the heating part 30 or an external force.

The light source unit 95 may be disposed under the upper bracket 40. For example, the light source unit 95 may be provided on the printed circuit board 51 disposed under the upper bracket 40, and an opening disposed at a position corresponding to the light source unit 95 may be formed in the upper bracket 40.

As another embodiment, light source unit 95 may be disposed on upper bracket 40, and the light source unit 95 may also be electrically connected to printed circuit board 51 disposed thereunder. In FIGS. 2 and 3, a structure in which the light source unit 95 is disposed on the upper bracket 40 is illustrated as an example of the electric range.

As described above, the light display region may be formed on the cover plate 20 at a portion corresponding to the light source unit 95. For example, the light source unit 95 may be provided in a form in which a plurality of light emitting diodes (LEDs) is arranged in a line.

When the heating part 30 operates, the light source unit 95 may be turned on to notify the user of whether the heating part 30 is used. Alternatively, the light source unit 95 may also change a lighting shape, or color, for example, of the plurality of LEDs to notify the user of a state in which the electric range is operating.

A number of the light source units 95 may be properly selected according to the number of the heating parts 30. In FIGS. 2 and 3, three light source units 95 are provided to correspond to three heating parts 30. However, the number of the light source units 95 is not limited thereto.

The base bracket 50 may be disposed under the upper bracket 40, the printed circuit board 51 may be installed on the base bracket 50, and the base bracket 50 may include a bottom plate and a side plate. The bottom plate may form a bottom surface of the base bracket 50, and the printed circuit board 51 may be installed on an upper surface of the base bracket 50.

The side plate may be bent from the bottom plate in the vertical direction of the electric range. The side plate may be bent from an edge of the bottom plate in the vertical direction.

The side plate may be disposed on sides of the bottom plate formed in a substantially quadrangular shape. When the plurality of upper brackets 40 is provided, the side plate may be formed on the sides of the bottom plate excluding sides adjacent to each other of the upper bracket 40.

The side plate may reinforce a strength of an entirety of the base bracket 50. That is, the side plate bent from the bottom plate may suppress the bottom plate having a board shape from being warped or damaged due to a weight of built-in components, such as the circuit board, or an external force.

The base bracket 50 may be formed of a plastic material, which is electrically insulative and is easily injection-molded, in order to be easy to manufacture, light, and electrically insulative; however, the material is not limited thereto.

A control part or portion may be formed on the printed circuit board 51. The printed circuit board 51 may receive power from an external power source and communicate with an external device in a wired or wireless manner.

A wireless communication circuit board 93 may be installed in the electric range in order to wirelessly communicate with an external device. The printed circuit board 51 may be electrically connected to the wireless communication circuit board 93.

The printed circuit board 51 may be electrically connected to the control board 90 and may receive a command input by the user from the control board 90. The printed circuit board 51 may be electrically connected to the light source unit 95 and the working coil and may control operation of the light source unit 95 and the working coil.

A heat sink 60 may be mounted on the printed circuit board 51. Various active and passive elements and electrical circuits for operation of the electric range may be mounted and formed on the printed circuit board 51.

The electric range according to an embodiment may further include the heat sink 60, a blower fan 70, and an air guide 80. Elements that generate heat when the electric range operates may be mounted on the printed circuit board 51.

For example, in the electric range, switching elements responsible for on/off control of the heating parts 30 generate a lot of heat. Accordingly, the elements need to be forcibly cooled to suppress the electric range from stopping or a problem from occurring in the electric range due to overheating.

In the electric range according to an embodiment, the heat sink 60, the blower fan 70, and the air guide 80 may be provided in order to forcibly cool heating of the elements of the printed circuit board 51. Hereinafter, elements that generate a lot of heat and need to be forcibly cooled are referred to as "heating elements 61".

The heat sink 60 may cool heat inside of the case 10 to protect components accommodated in the case 10. The heat sink 60 may be mounted on the printed circuit board 51 and cool heat of the circuit board. In addition, the heat sink 60 may cool heat generated due to an electromagnetic interaction when the heating part 30 operates.

For example, a plurality of cooling fins 610 may be formed on the heat sink 60, and the air guide 80 may be provided to cover the cooling fins 610 and guide air to flow to the cooling fins 610. The heat sink 60 and the cooling fins 610 will be described hereinafter with reference to the accompanying drawings.

The blower fan 70 may be installed on the base bracket 50 and to discharge air toward the heat sink 60. The blower fan 70 may be electrically connected to the printed circuit board 51, and operation of the blower fan 70 may be controlled by the control part or portion implemented on the printed circuit board 51.

Referring to FIG. 5, a guide wall, which guides a flow of air in a direction in which the heat sink 60 is disposed, may be formed at an exit of the blower fan 70 in order to guide the air, which is forcibly moved by the blower fan 70, to flow to the heat sink 60. When the blower fan 70 operates, air in the case 10 is forcibly moved toward the heat sink 60, and the printed circuit board 51 and on inner portion of the case 10 may be cooled by the heat sink 60.

Figure 6:
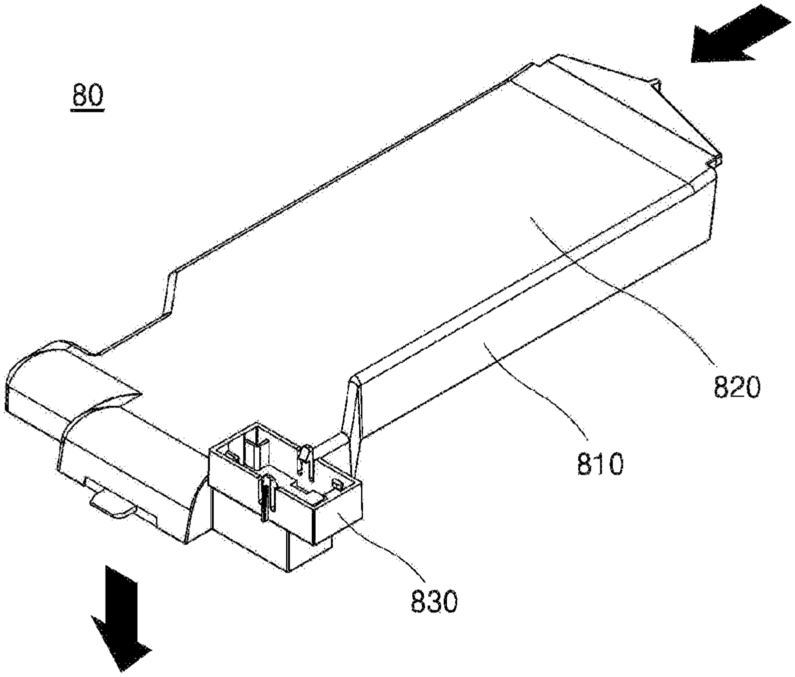
FIG. 6 is a perspective view of an air guide according to an embodiment.
Figure 7:
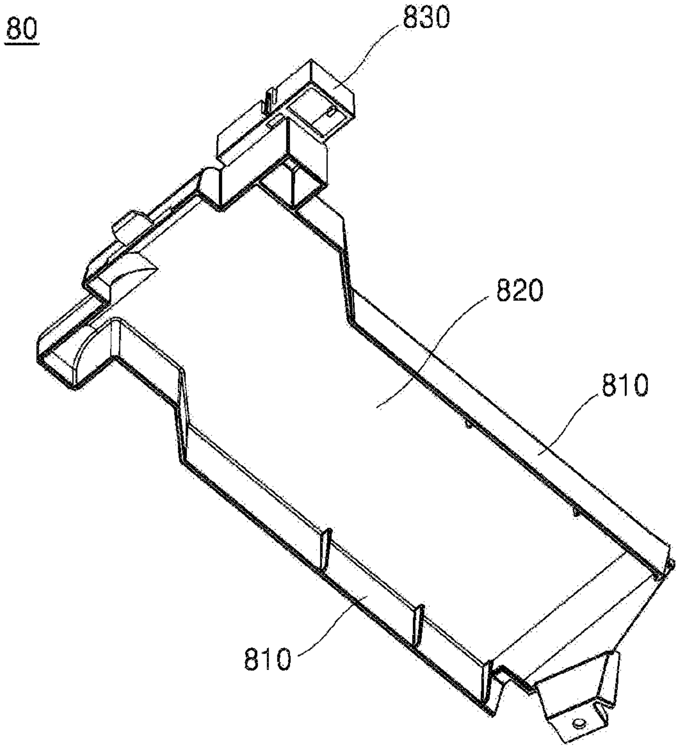
FIG. 7 is a perspective view of the air guide of FIG. 6 from another direction.
Figure 8:
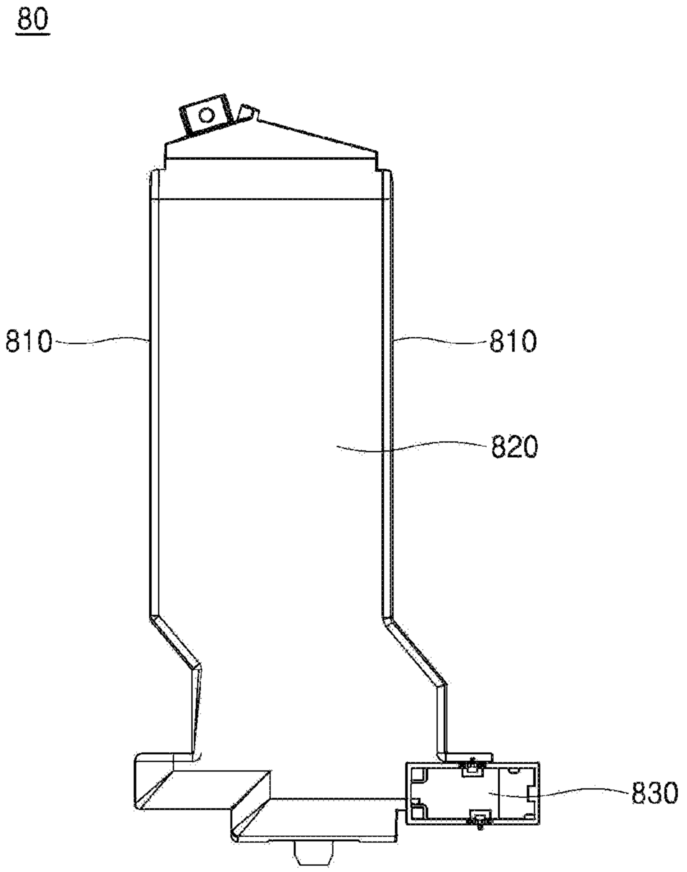
FIG. 8 is a plan view of the air guide according to an embodiment.
Figure 9:
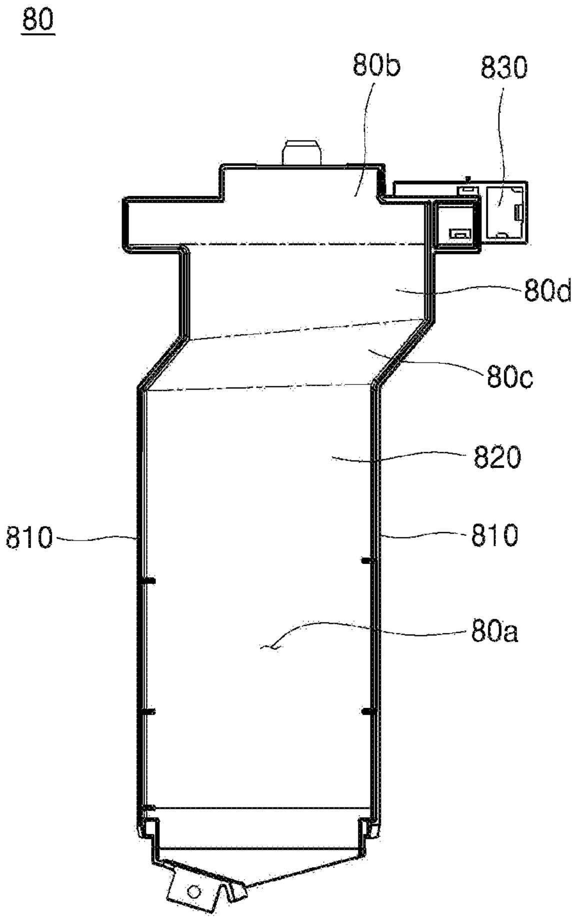
FIG. 9 is a bottom view of the air guide according to an embodiment.

FIG. 6 is a perspective view of an air guide according to an embodiment. FIG. 7 is a perspective view of the air guide of FIG. 6 from another direction. FIG. 8 is a plan view of the air guide according to an embodiment. FIG. 9 is a bottom view of the air guide according to an embodiment.

The air guide 80 may communicate with the blower fan 70 and to surround the heat sink 60 to form a flow path of air which cools the heat sink 60. For example, the air guide 80 may be formed of a plastic material which is electrically insulative and is easily injection-molded; however, the material is not limited thereto.

Arrows illustrated in FIG. 6 indicate a flow direction of air. Referring to FIG. 6, the air guide 80 may change the flow direction of the air. That is, the air guide 80 may be formed so that air flows in a frontward-rearward direction of the electric range at an entrance of the air guide 80, and the air flows in the vertical direction of the electric range at an exit of the air guide 80. Due to such structure, air discharged by the blower fan 70 may flow into the air guide 80 in the frontward-rearward direction of the electric range and may be discharged from the air guide 80 in a downward direction of the electric range.

The air guide 80 may be detachably coupled to the base bracket 50. For example, a rear side of the air guide 80 adjacent to the blower fan 70 may be coupled to the base bracket 50 by a coupling unit, such as a screw bolt. In addition, for example, a front side of the air guide 80, which is a portion through which air is discharged, may be coupled to the base bracket 50 in an engagement manner.

The air guide 80 may include a first sidewall 810 and a second sidewall, and a flow space in which air flows may be formed by the first sidewall 810 and the second sidewall. The first sidewall 810 may be provided as a pair of first sidewalls 810 disposed at two sides of the heat sink 60. The upper wall 820 may be provided to be coupled to upper ends of the pair of first sidewalls 810 and to cover the heat sink 60.

A space formed by the first sidewalls 810 and the second sidewall may become the flow space in which the air flows. The heat sink 60 may be disposed in the flow space, and thus, the heat sink 60 may be cooled by air flowing in the flow space of the air guide 80.

A communication board installation part or portion 830 may be provided in the air guide 80. The communication board installation part 830 may be disposed in a portion that protrudes from an end portion of the upper bracket 40 in a lateral direction in a state in which the air guide 80 is installed in the electric range.

Due to such structure, the wireless communication circuit board 93 installed in the communication board installation part 830 may not overlap the upper bracket 40 formed of a metal material in the vertical direction, and thus, the wireless communication circuit board 93 may smoothly communicate with an external device without communication being interfered with by the upper bracket 40 formed of the metal material.

Referring to FIG. 9, the air guide 80 may include a first region 80*a*, a second region 80*b*, a third region 80*c*, and a fourth region 80*d*. The first region 80*a* to the fourth region 80*d* may be regions into which the flow space formed in the air guide 80 is divided.

The first region 80*a* may communicate with the blower fan 70 and may guide air to flow in a lateral direction of the base bracket 50. In this case, the heat sink 60 may be disposed in the first region 80*a*. Air flowing into the air guide 80 by the blower fan 70 may flow to the heat sink 60 and cool the heat sink 60 while passing through the first region 80*a* of the air guide 80.

The second region 80*b* may be bent in a vertical direction of the base bracket 50 and may guide air to be discharged to the outside. As the second region 80*b* is formed in the downward direction of the electric range, the second region 80*b* may change a flow direction of air flowing into the air guide 80.

That is, in the air guide 80, as the upper wall 820 is bent downward in the second region 80*b*, air discharged from the second region 80*b* may be guided toward a portion under the case 10. Due to the above-described structure, as illustrated by the arrows in FIG. 6, air discharged by the blower fan 70 may flow into the air guide 80 in the frontward-rearward direction of the electric range and discharged from the air guide 80 in the downward direction of the electric range.

The third region 80*c* and the fourth region 80*d* may be provided between the first region 80*a* and the second region 80*b*. The third region 80*c* may extend from the first region 80*a* and change a flow direction of air passing through the first region 80*a*. In the air guide 80, the first sidewall 810 is bent to be inclined at an end portion of the first region 80*a* to form the third region 80*c*.

That is, the first sidewall 810 may be inclined with respect to a frontward-rearward direction of the air guide 80 at an entrance of the third region 80*c* of the air guide 80. Due to such structure, in the third region 80*c*, air may flow in a direction inclined with respect to the frontward-rearward direction of the air guide 80.

As the third region 80*c* is formed as the above-described structure, when the air guide 80 is installed on the base bracket 50, elements disposed on the printed circuit board 51 may avoid meeting the first sidewall 810 at a portion overlapping the air guide 80 in the vertical direction. That is, the third region 80*c* may have an inclined structure due to a necessity to avoid the elements disposed on the printed circuit board 51.

The fourth region 80*d* may extend from the third region 80*c*, communicate with the second region 80*b*, and change a flow direction of air passing through the third region 80*c*. In the air guide 80, the first sidewall 810 is bent to be inclined at an end portion of the third region 80*c* to form the fourth region 80*d*.

That is, the first sidewall 810 at an exit of the third region 80*c* of the air guide 80 may be inclined with respect to the first sidewall 810 of the third region 80*c*. Due to such structure, in the fourth region 80*d*, a flow direction of air of the air guide 80 may be changed to the frontward-rearward direction of the air guide 80 again.

Air passing through the fourth region 80*d* may be discharged to a portion under the electric range through the second region 80*b*. Referring to FIG. 9, the flow direction of the air flowing in the air guide 80 to an exit of the fourth region 80*d* in the frontward-rearward direction of the electric range may be changed in the second region 80*b*, and the air may flow in the downward direction of the electric range through an exit of the second region 80*b* and may be discharged from the air guide 80.

As the upper wall 820 may be bent downward at the second region 80*b*, the air guide 80 may guide air discharged from the second region 80*b* to flow toward the portion under the case 10. That is, air may be discharged from the air guide 80 through the second region 80*b* illustrated in FIG. 9 and may flow in the downward direction of the electric range, that is, toward the portion under the case 10.

Figure 10:
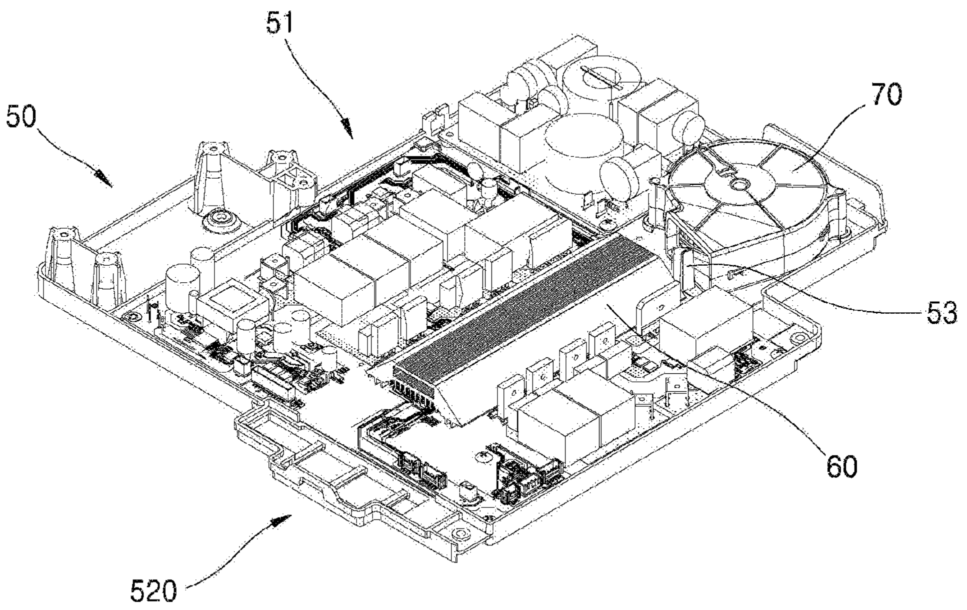
FIG. 10 is a perspective view illustrating a state in which a printed circuit board is mounted on a base bracket according to an embodiment.
Figure 11:
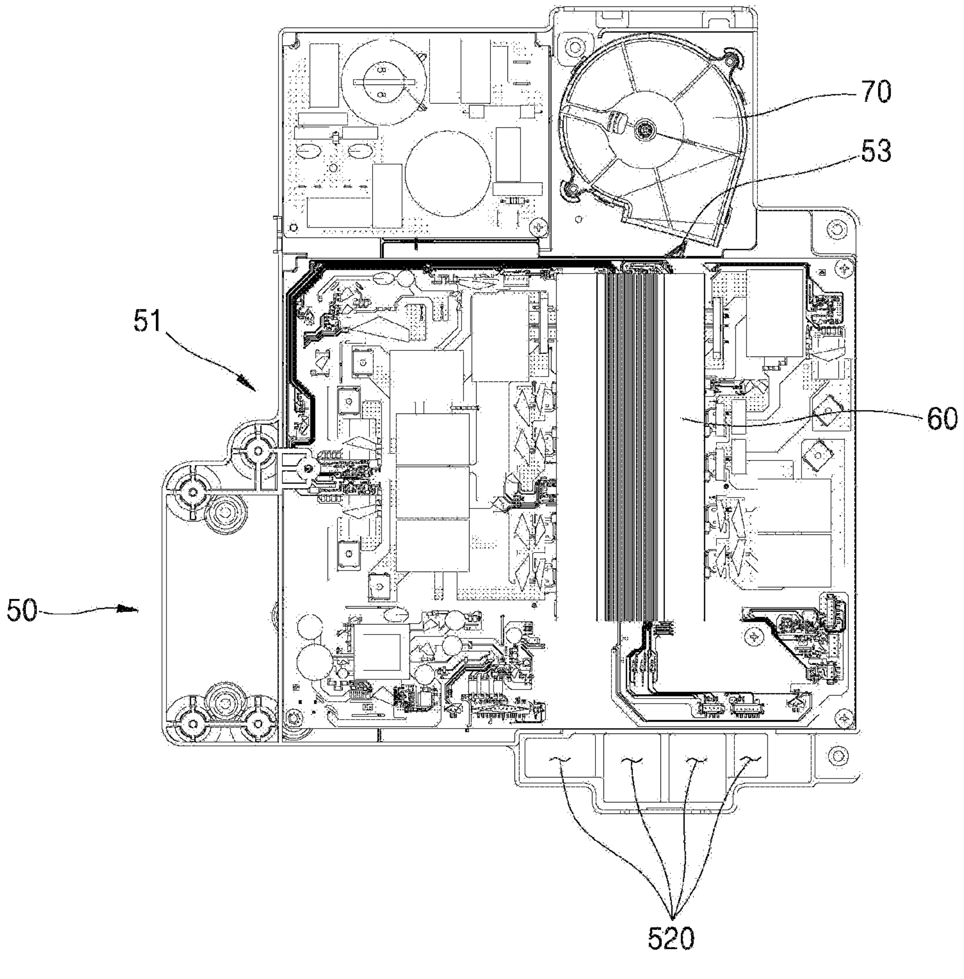
FIG. 11 is a plan view of the state of FIG. 10.
Figure 12:
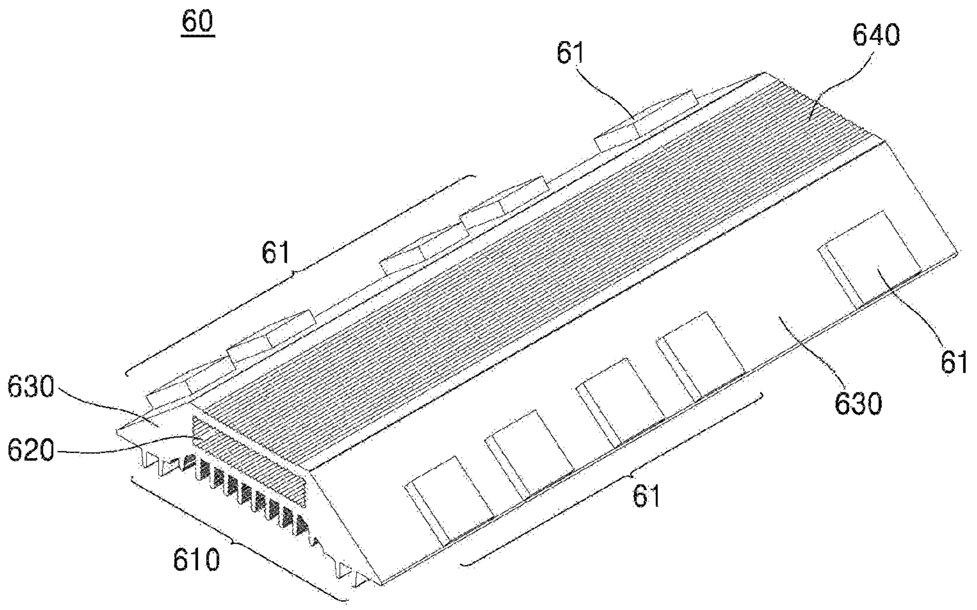
FIG. 12 is a perspective view of a heat sink according to an embodiment.
Figure 13:
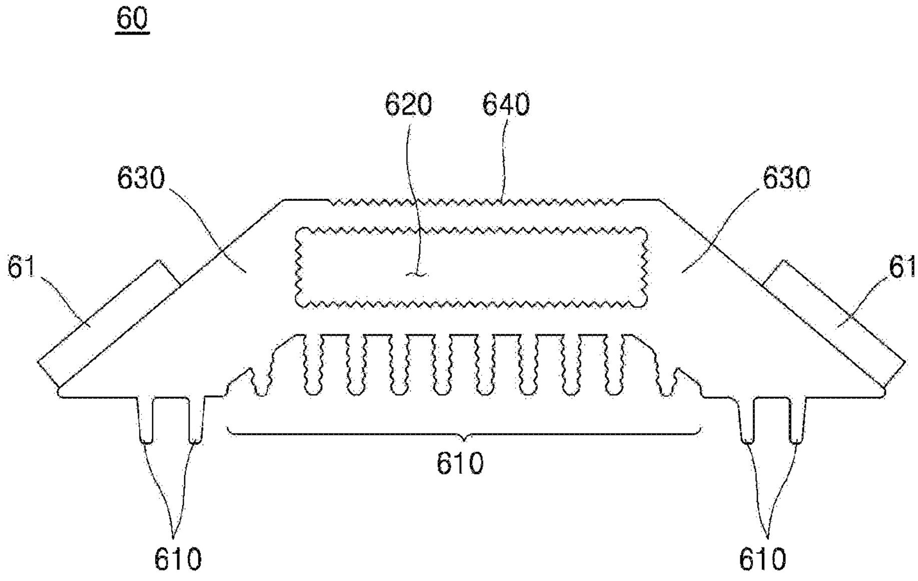
FIG. 13 is a front view of the heat sink according to an embodiment.

FIG. 10 is a perspective view illustrating a state in which the printed circuit board is mounted on the base bracket according to an embodiment. FIG. 11 is a plan view illustrating the state of FIG. 10. FIG. 12 is a perspective view of the heat sink according to an embodiment. FIG. 13 is a front view of the heat sink according to an embodiment.

A longitudinal direction of the heat sink 60 may extend parallel to a flow direction of air passing through the air guide 80. Due to such structure, cooling efficiency of the heat sink 60 may be improved by increasing a contact area and a contact time between the heat sink 60 and air which is forcibly moved. A longitudinal direction of the air guide 80 may also extend substantially parallel to a flow direction of air to correspond to the above-described layout of the heat sink 60.

As illustrated in FIGS. 12 and 13, the plurality of cooling fins 610 may be provided on the heat sink 60. The plurality of cooling fins 610 may protrude from a lower surface of the heat sink 60 in the downward direction and may extend parallel to the longitudinal direction of the heat sink 60. The cooling fins 610 may increase a contact area between the heat sink 60 and air to improve cooling efficiency of the heat sink 60.

The plurality of cooling fins 610 may be disposed on the lower surface of the heat sink 60 and spaced a proper or predetermined interval from each other in a widthwise direction of the heat sink 60. In this case, the cooling fins 610 may be formed on an inclined part or portion 630 and a flat part or portion 640 of the heat sink 60.

In addition, the heat sink 60 may include a flow pass 620 that passes through the heat sink 60 in the longitudinal direction and forms a flow path of air. The flow pass 620 may extend in the longitudinal direction of the heat sink 60 to pass through the flat part 640 of the heat sink 60.

The flow pass 620 may increase a contact area between the heat sink 60 and air like the cooling fin 610 to increase cooling efficiency of the heat sink 60. In this case, an irregular portion may be formed on an inner surface of the flow pass 620. The irregular portion may increase a contact area between the heat sink 60 and air to increase cooling efficiency of the heat sink 60.

The heat sink 60 may include the inclined part 630 disposed at two sides and having an inclined upper surface and the flat part 640 which is formed in a central portion, in which the flow pass 620 is formed, and an upper surface of which is formed as a flat surface.

An irregular portion may be formed on the upper surface of the flat part 640. The irregular portion may increase a contact area between the heat sink 60 and air to increase cooling efficiency of the heat sink 60.

All or some of the heating elements 61 provided on the printed circuit board 51 may be installed on the upper surface of the inclined part 630. Accordingly, air forcibly moved by the blower fan 70 may cool the heating elements 61 mounted on the inclined part 630 of the heat sink 60 to effectively suppress overheating of the printed circuit board 51.

The inclined part 630 may have a structure a thickness of which decreases toward an edge thereof. Accordingly, as the structure of the inclined part 630 serves a function similar to that of the cooling fin 610, the heating elements 61 installed on the inclined part 630 may be effectively cooled.

Figure 14:
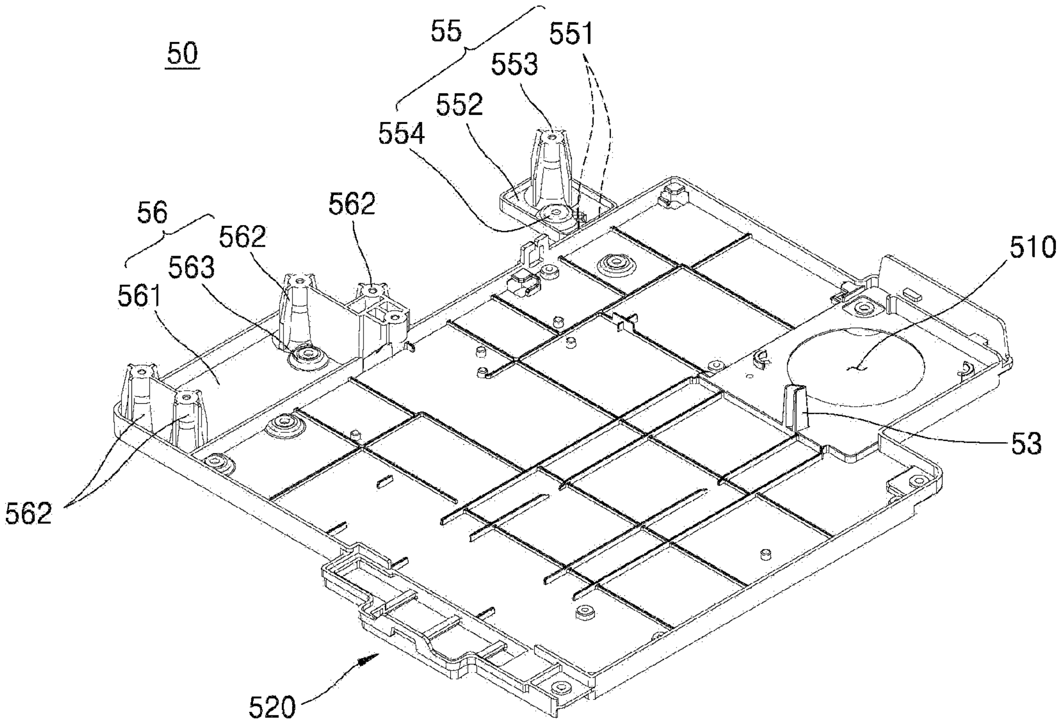
FIG. 14 is a perspective view of a base bracket according to an embodiment.
Figure 15:
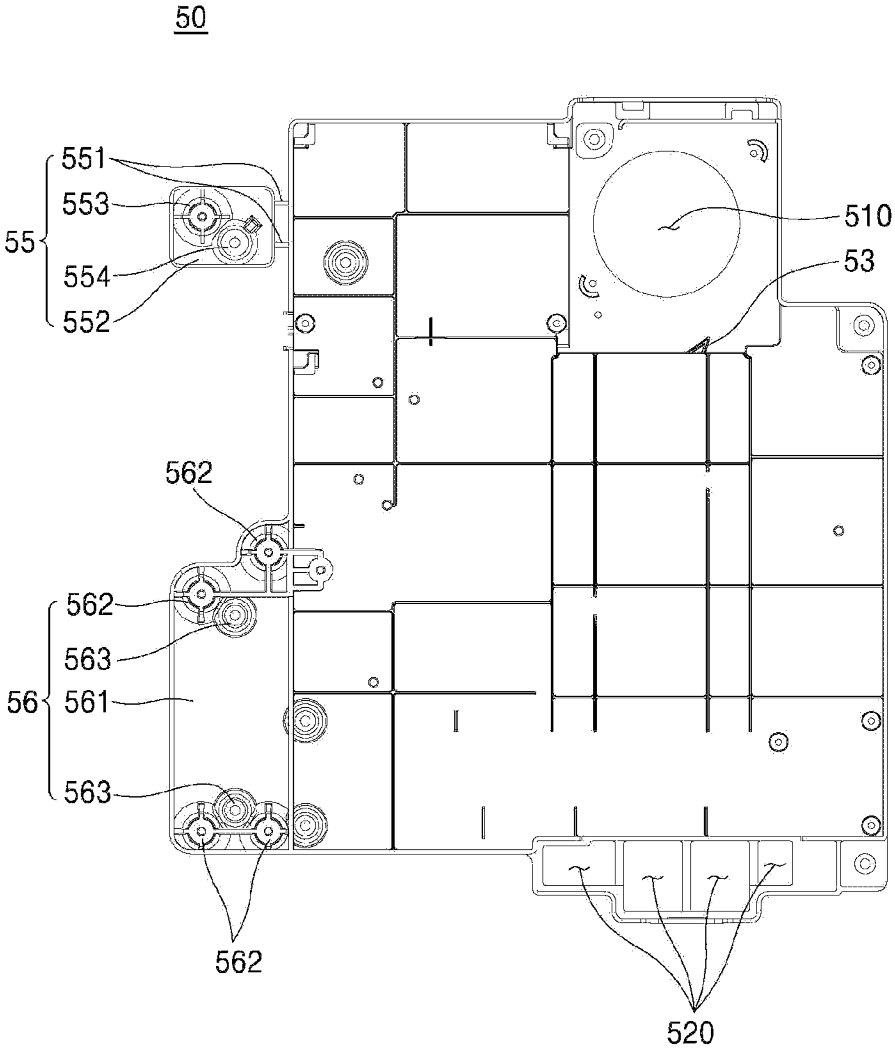
FIG. 15 is a plan view of the base bracket according to an embodiment.

FIG. 14 is a perspective view of a base bracket according to an embodiment. FIG. 15 is a plan view of the base bracket according to an embodiment.

The base bracket 50 may include a first ventilation part or portion 510 formed in a portion corresponding to the blower fan 70 and a second ventilation part or portion 520 formed in a portion corresponding to the fourth region 80*d*. In this case, the first ventilation part 510 may be formed in a shape corresponding to a shape of the blower fan 70, and the second ventilation part 520 may be formed in a shape corresponding to a shape of the fourth region 80*d*.

When the blower fan 70 operates, air may flow upward from the first ventilation part 510 and may flow into the blower fan 70, a flow direction of the air may be changed by the blower fan 70, and the air may flow in the frontward-rearward direction of the electric range to pass through the air guide 80 and the heat sink 60. The flow direction of the air may be changed at the exit of the air guide 80 again, and the air may flow in the downward direction of the electric range, may pass through the second ventilation part 520, and may be discharged to the outside of the air guide 80.

A pair of the inclined part 630 of the heat sink 60 may be provided, and the pair of inclined parts 630 may be disposed at positions that are symmetrical with respect to a center of the flat part 640. The heating elements 61, which need to be cooled, may be disposed on the inclined parts 630.

Due to such structure, the heating elements 61 may be disposed at symmetrical positions at two sides of the heat sink 60. In order to uniformly cool the heating elements 61 disposed at the two sides of the heat sink 60, air discharged through the exit of the blower fan 70 needs to be guided to uniformly flow to the two sides of the heat sink 60. Accordingly, in order for the air to uniformly flow to the two sides of the heat sink 60, the electric range according to an embodiment may include a vane part or vane 53.

The vane part 53 may be disposed at a portion at which the blower fan 70 communicates with the air guide 80, and the air guide 80 may control a flow direction of air so that the air uniformly flows to the two sides of the heat sink 60. For example, the vane part 53 may be formed on the base bracket 50. As another embodiment, vane part 53 may be integrally formed with air guide 80 at the entrance of the air guide 80. As still another embodiment, vane part 53 may also be integrally formed with a housing of blower fan 70 at the exit of the blower fan 70.

Figure 16:
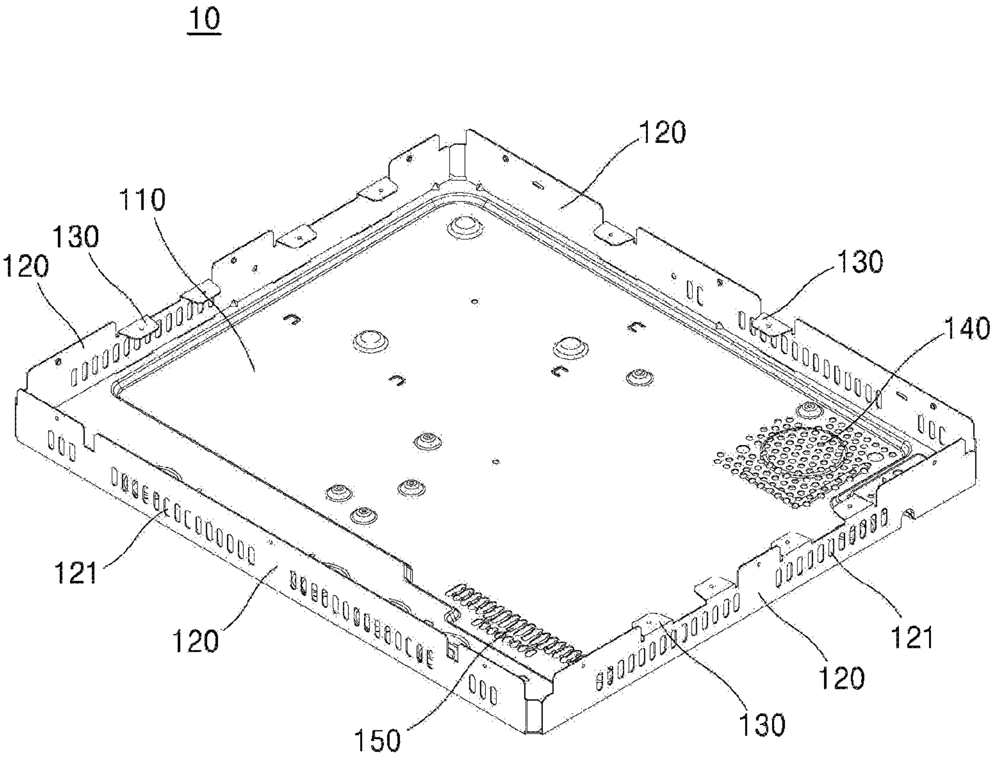
FIG. 16 is a perspective view of a case according to an embodiment.
Figure 17:
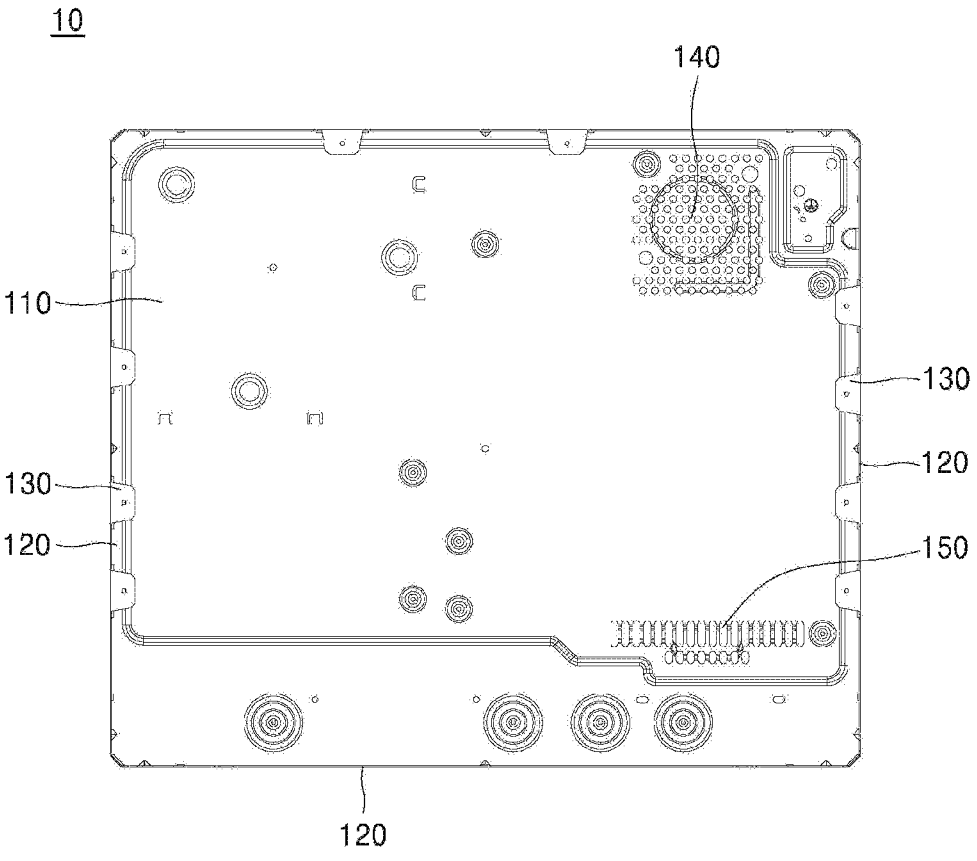
FIG. 17 is a plan view of the case according to an embodiment.

FIG. 16 is a perspective view of a case according to an embodiment. FIG. 17 is a plan view illustrating the case according to an embodiment.

The case 10 may include a first through port 140 and a second through port 150 in order to allow air to be forcibly moved by the blower fan 70 to effectively flow and be discharged.

The first through port 140 may be formed in a portion corresponding to the first ventilation part 510, and the second through port 150 may be formed in a portion corresponding to the second ventilation part 520. The first through port 140 and the second through port 150 may be formed by punching the first casing 110 forming the bottom surface of the case 10, for example.

A plurality of the first through port 140 and the second through port 150 may be provided. As the case 10 is an outermost wall of the electric range, the first through port 140 and the second through port 150 may be formed as holes having relatively small areas, and the plurality of first through ports 140 and the plurality of second through ports 150 may be formed in order to suppress external matter from flowing into the electric range through the first through ports 140 and the second through ports 150 formed in the case 10.

The electric range may include the heating part 30 which heats the heating target and the upper bracket 40 which supports the heating part 30. In this case, structure for stably installing the heating part 30 and the upper bracket 40 in the electric range is required.

More particularly, even when overall shapes of electric ranges are similar, different shapes, sizes, and weights, for example, of heating parts 30 and upper brackets 40 may be designed. In this case, a support structure a position of which is easily changed in order to stably support the heating parts 30 and the upper brackets 40 having different shapes is required.

Hereinafter, a first support structure 55 having a structure compatible with the heating parts 30 and the upper brackets 40 having various shapes, sizes, and weights, for example, and capable of stably supporting the heating parts 30 and the upper brackets 40 will be described. In addition, a second support structure 56 that supports the heating parts 30 and the upper brackets 40 will be described along with the first support structure 55.

Figure 18:
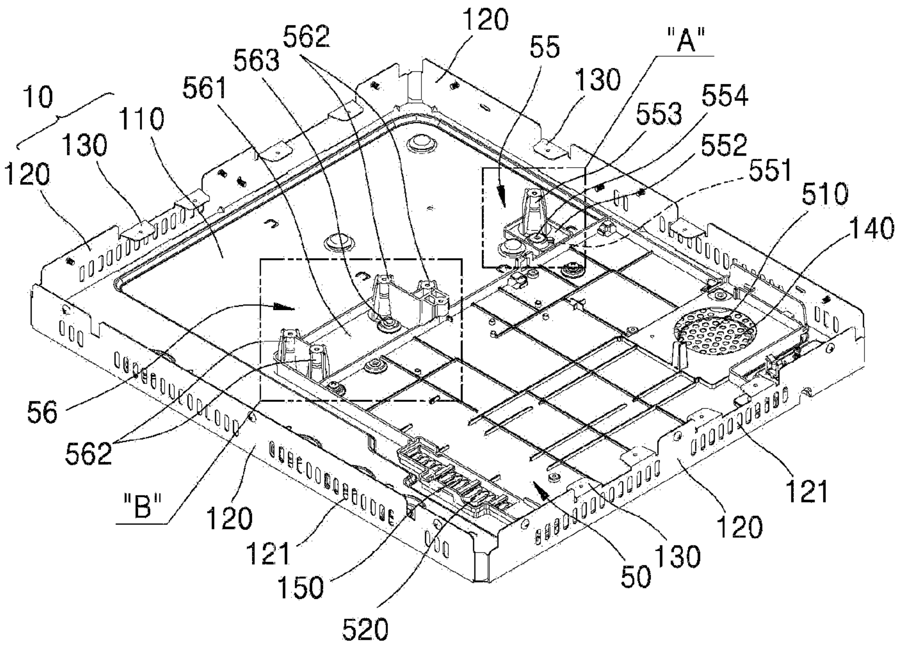
FIG. 18 is a view illustrating a state in which a base bracket is assembled to the case according to an embodiment.
Figure 19:
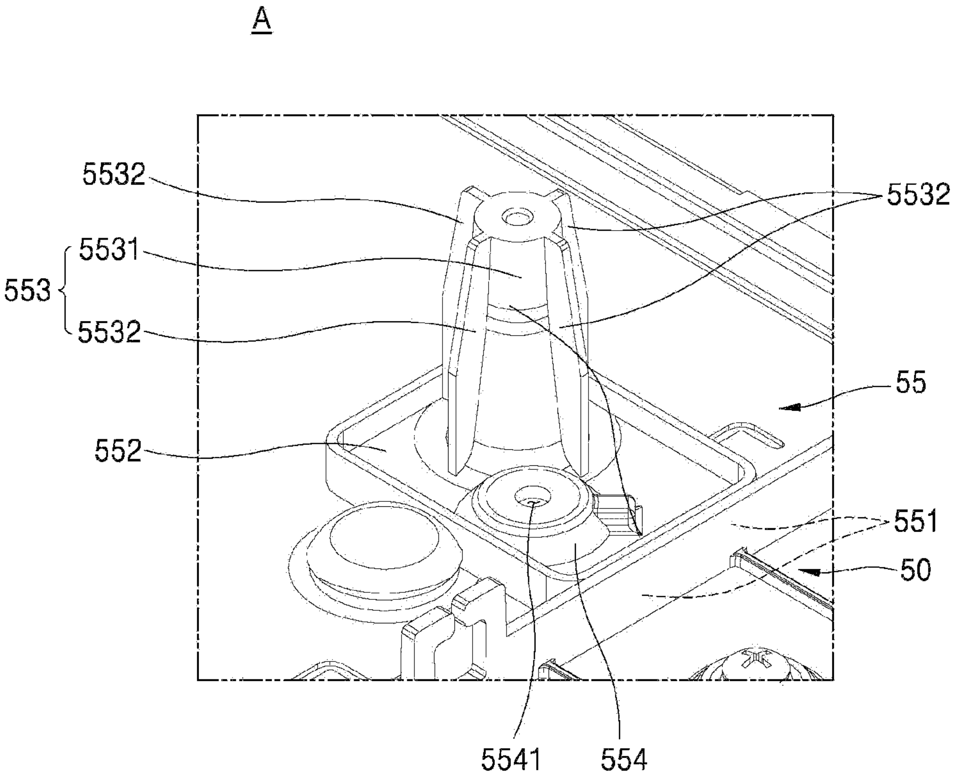
FIG. 19 is an enlarged view of portion A in FIG. 18, in which a first support structure is disposed.

FIG. 18 is a view illustrating a state in which the base bracket is assembled to the case according to an embodiment. FIG. 19 is an enlarged view of portion A in FIG. 18, in which the first support structure is disposed. In addition, the first support structure 55 and the second support structure 56 will be described with reference to FIGS. 14 and 15 again.

The electric range according to an embodiment may include the plurality of heating parts 30 and the plurality of upper brackets 40. Among the plurality of heating parts 30, a widest heating part 30 may be disposed above the printed circuit board 51. The heating part 30 disposed above the printed circuit board 51 and the upper bracket 40 that supports the heating part 30 may be supported by the base bracket 50 and the third casing 130 of the case 10.

Among the plurality of heating parts 30, the heating part 30 and the upper bracket 40 that supports the heating part 30, which are disposed at positions not overlapping the printed circuit board 51 in the vertical direction, may be supported by the third casing 130 of the case 10, the first support structure 55, and the second support structure 56. In this case, the heating part 30 and the upper bracket 40 disposed at the positions not overlapping the printed circuit board 51 in the vertical direction may be supported by the first support structure 55 and the second support structure 56. In the electric range according to an embodiment, two heating parts 30 disposed at positions not overlapping the printed circuit board 51 in the vertical direction may be supported by one upper bracket 40, and the one upper bracket 40 may be supported by the first support structure 55 and the second support structure 56.

The electric range according to an embodiment may include the first support structure 55. The first support structure 55 may be disposed under the upper bracket 40 and may support weights of the upper bracket 40 and the heating part 30. The first support structure 55 may be integrally manufactured with the base bracket 50 and provided to be detachable from the base bracket 50.

In this case, the first support structure 55 may be integrally formed with the base bracket 50, for example, in an injection molding manner. After the first support structure 55 is integrally manufactured, the first support structure 55 may be separated from the base bracket 50 as necessary.

The first support structure 55 may be used in three ways.

First, the first support structure 55 may be disposed to support the weights of the upper bracket 40 and the heating part 30 in a state in which the first support structure 55 is coupled to the base bracket 50. Accordingly, in the state in which the first support structure 55 is not separated from the base bracket 50, that is, the first support structure 55 is coupled to the base bracket 50, the first support structure 55 may be positioned at a position overlapping the upper bracket 40.

Second, the first support structure 55 may be separated from the base bracket 50 and may support the weights of the upper bracket 40 and the heating part 30 at a position spaced apart from the base bracket 50. Third, when the first support structure 55 does not need to be used, the first support structure 55 may be separated and removed from the base bracket 50. In FIGS. 3 and 5, the electric range in a state in which the first support structure 55 is removed from the electric range is illustrated.

As described above, even when overall shapes of electric ranges are similar, different shapes, sizes, and weights, for example, of heating parts 30 and upper brackets 40 may be designed. In this case, in order to stably support the heating part 30 and the upper bracket 40 or to reduce the number of components provided in the electric range and improve a volumetric efficiency, by separating the first support structure 55 from the base bracket 50, an arrangement position of the first support structure 55 needs to be changed, or the first support structure 55 needs to be removed. Accordingly, the first support structure 55 needs to be provided to be easily separated from the base bracket 50.

The first support structure 55 may include a breakage part or portion 551, a first support part or portion 552, a first support protrusion 553, and a first coupling part or portion 554. The breakage part 551 may be integrally manufactured with the base bracket 50 and provided to be broken when the first support structure 55 is separated from the base bracket 50. As illustrated in FIG. 15, the breakage part 551 may be formed in a thin bar shape to be easily broken and a plurality of the breakage part 551 may be provided. An operator may separate the first support structure 55 from the base bracket 50 by applying an external force to the breakage part 551 to break the breakage part 551.

The first support part 552 may be coupled to the breakage part 551 and supported by the first casing 110 forming the bottom surface of the case 10. The first support part 552 may form a bottom of the first support structure 55, and the first support protrusion 553 and the first coupling part 554 may be formed on the first support part 552.

The first support protrusion 553 may protrude upward from the first support part 552 and support a lower surface of the upper bracket 40. The first support protrusion 553 may include a first shell 5531 and a second shell 5532.

The first shell 5531 may protrude upward from the first support part 552. The second shell 5532 may protrude from a side surface of the first shell 5531. A plurality of the second shell 5532 may be provided, and radially disposed about the first shell 5531.

The plurality of second shells 5532 may protrude from the side surface of the first shell 5531 to different lengths. In addition, any one of the plurality of second shells 5532 may also be provided so that a length to which the any one protrudes from the side surface of the first shell 5531 varies when viewed from above and below.

Upper end surfaces of the first shell 5531 and the second shell 5532 may contact with the lower surface of the upper bracket 40 to support the upper bracket 40. Due to the structure including the first shell 5531 and the second shell 5532, the first support protrusion 553 may stably support the upper bracket 40, may be manufactured with a small volume, and may not be deformed even by an external force applied in the lateral direction.

The first coupling part 554 may protrude upward from the first support part 552 and may be formed at a position spaced apart from the first support protrusion 553 in the lateral direction, and a coupling unit coupled to the first casing 110 may be installed on the first coupling part 554. A first coupling hole 5541, into which the coupling unit coupled to the first casing 110 may be inserted, may be formed in the first coupling part 554.

The first support structure 55 may be coupled to the first casing 110 by inserting the coupling unit, such as a screw bolt, into the first coupling hole 5541 and coupling the coupling unit to a coupling through hole formed in the first casing 110.

As the first support structure 55 needs to be separated from the base bracket 50 and coupled at a proper position on the first casing 110, a plurality of the coupling through hole to which the coupling unit is coupled may be provided in the first casing 110 at various positions.

Figure 20:
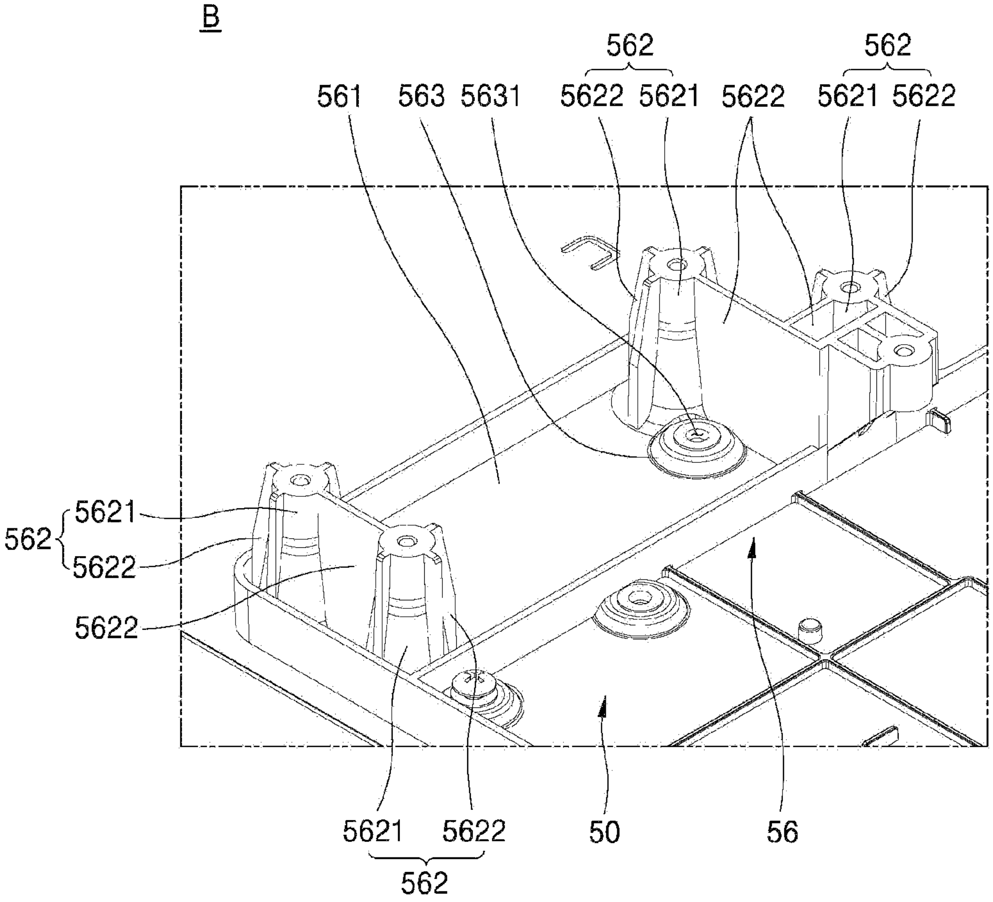
FIG. 20 is an enlarged view of portion B in FIG. 18, in which a second support structure is disposed.

FIG. 20 is an enlarged view of portion B in FIG. 18, in which the second support structure is disposed. As illustrated in FIG. 20, the electric range may further include the second support structure 56. The second support structure 56 may be integrally formed with the base bracket 50, and along with the first support structure 55, may support the upper bracket 40.

The second support structure 56 may protrude from an edge of the base bracket 50, may be formed at a position spaced apart from the first support structure 55, and may support the weights of the upper bracket 40 and the heating part 30. The second support structure 56 may include a second support part or support 561, a second support protrusion 562, and a second coupling part or portion 563.

The second support part 561 may protrude from one side of the base bracket 50 and may be supported by the first casing 110 forming the bottom surface of the case 10. The second support part 561 may form a bottom of the second support structure 56, and the second support protrusion 562 and the second coupling part 563 may be formed on the second support part 561.

The second support protrusion 562 may protrude upward from the second support part 561 and may support the lower surface of the upper bracket 40. A plurality of the second support protrusion 562 may be provided and may include a first piece 5621 and a second piece 5622.

The first piece 5621 may protrude upward from the second support part 561. The second piece 5622 may protrude from a side surface of the first piece 5621 and a plurality of the second piece 5622 may be provided radially disposed about the first piece 5621.

The plurality of second pieces 5622 may also protrude from the side surface of the first piece 5621 to different lengths. In addition, any one of the plurality of second pieces 5622 may also be provided so that a length to which the any one protrudes from a side surface of the first piece 5621 varies when viewed from above and below. In addition, some of the plurality of second pieces 5622 may be formed to connect two first pieces 5621.

Upper end surfaces of the first piece 5621 and the second piece 5622 may contact with the lower surface of the upper bracket 40 to support the upper bracket 40. Due to this structure including the first piece 5621 and the second piece 5622, the second support protrusion 562 may stably support the upper bracket 40, may be manufactured with a small volume, and may not be deformed even by an external force applied in the lateral direction.

The second coupling part 563 may protrude upward from the second support part 561 and may be formed at a position spaced apart from the second support protrusion 562 in the lateral direction, and a coupling unit coupled to the first casing 110 may be installed on the second coupling part 563. A second coupling hole 5631, into which the coupling unit coupled to the first casing 110 may be inserted, may be formed in the second coupling part 563. The second support structure 56 may be coupled to the first casing 110 by inserting the coupling unit, such as a screw bolt, into the second coupling hole 5631 and coupling the coupling unit to a coupling through hole formed in the first casing 110.

Figure 21:
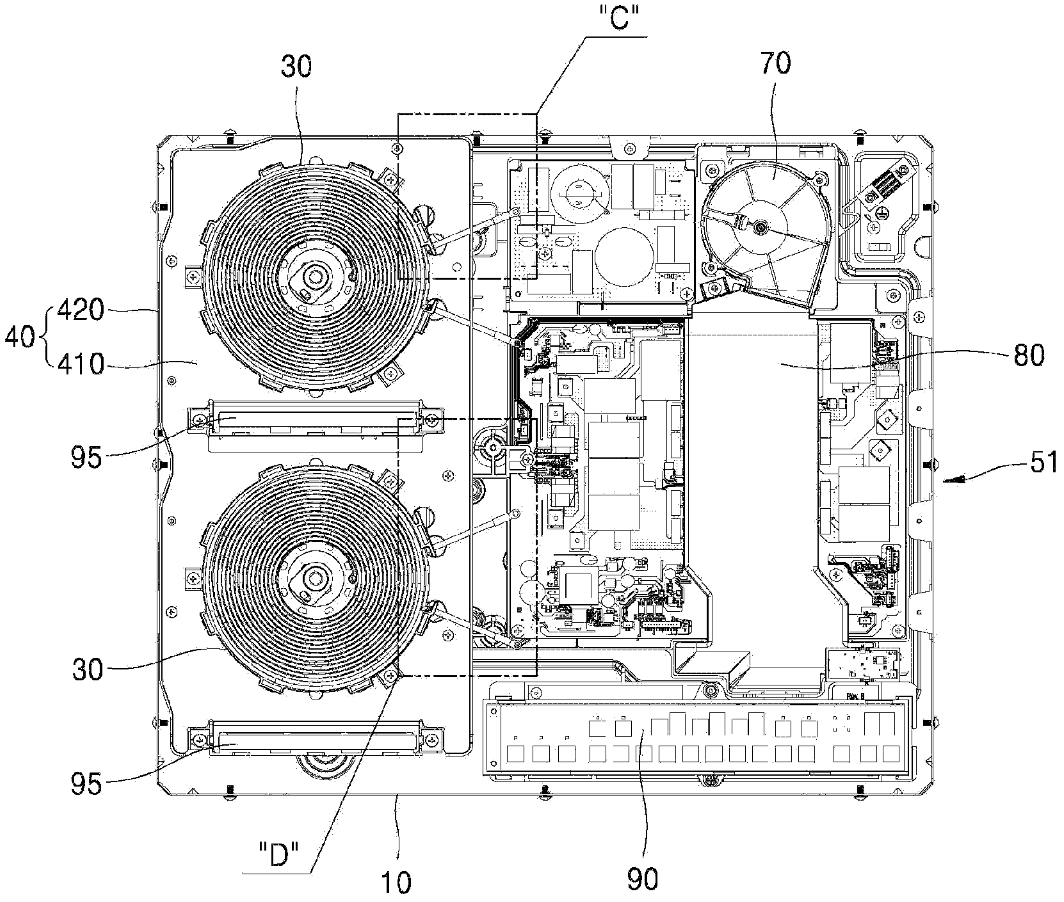
FIG. 21 is a plan view of the electric range according to an embodiment from which some components are removed, that is, for the sake of clear description, an upper bracket and a heating part which are disposed above a printed circuit board are omitted in FIG. 21.
Figure 22:
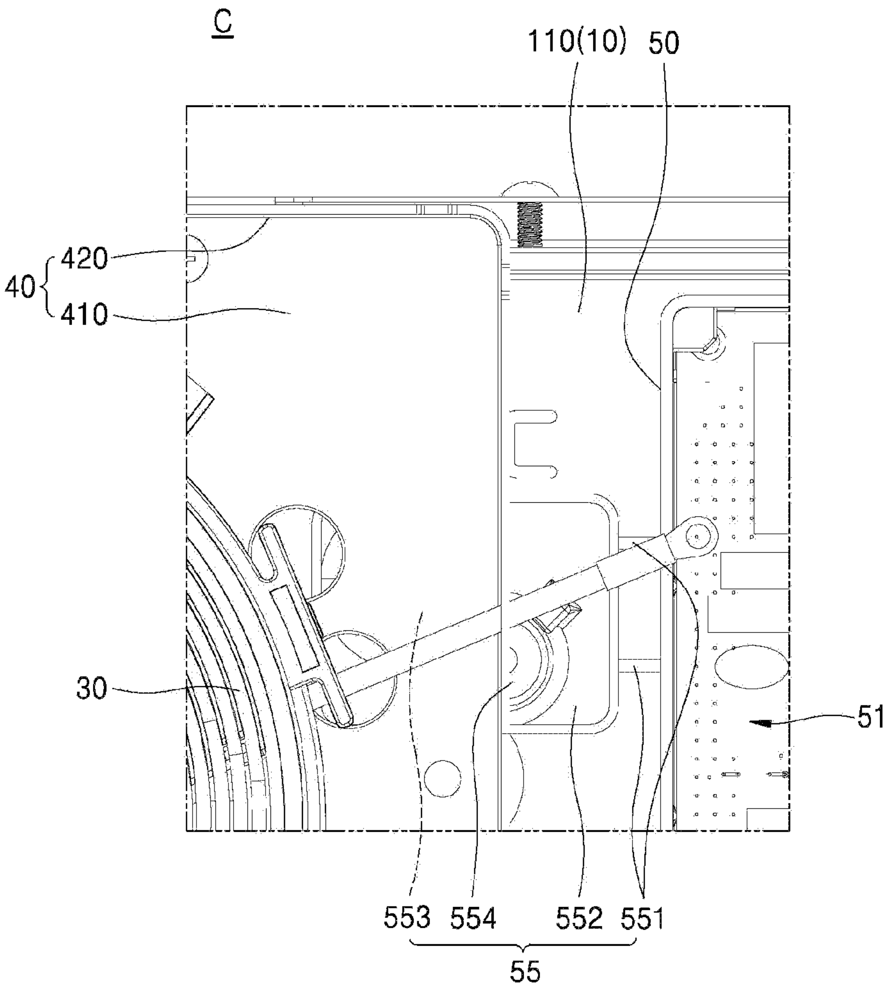
FIG. 22 is an enlarged view of portion C of FIG. 21.
Figure 23:
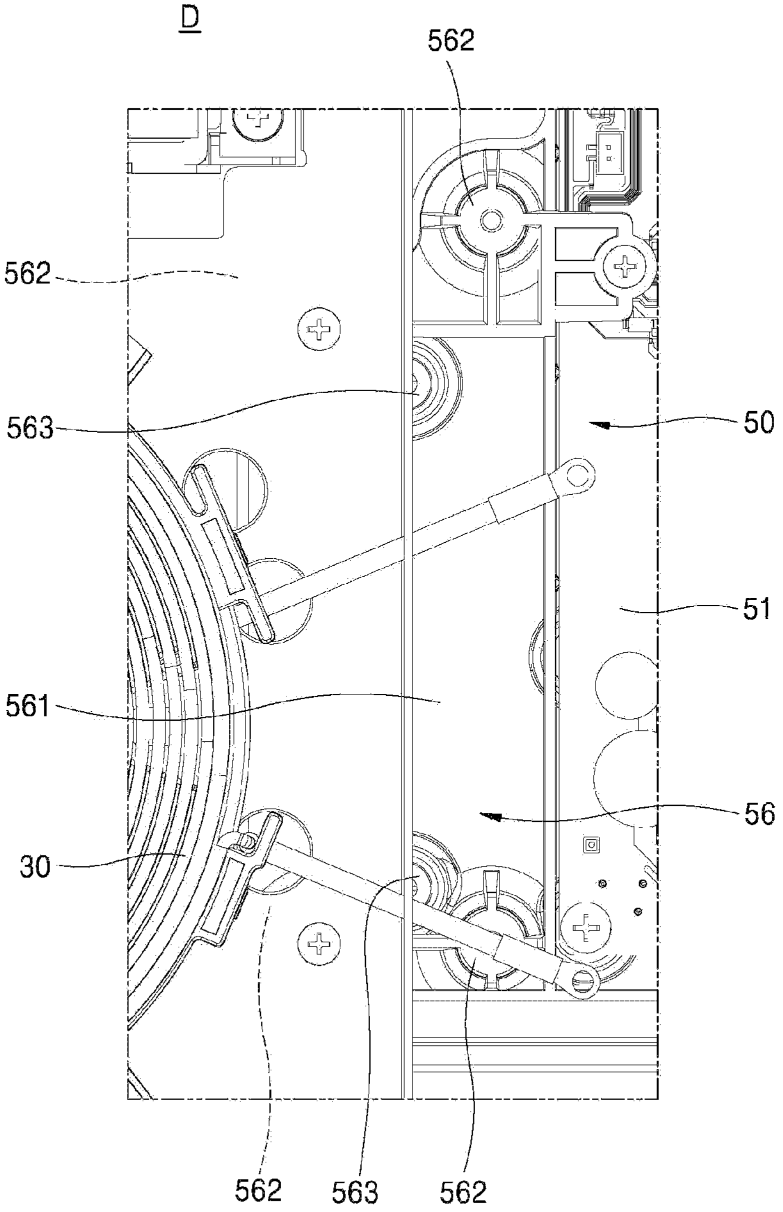
FIG. 23 is an enlarged view of portion D of FIG. 21.

FIG. 21 is a plan view of the electric range according to an embodiment from which some components are removed. For the sake of clear description, the upper bracket 40 and the heating part 30 which are disposed above the printed circuit board 51 are omitted in FIG. 21. FIG. 22 is an enlarged view of portion C of FIG. 21. FIG. 23 is an enlarged view of portion D of FIG. 21.

FIG. 22 illustrates a structure in which the first support structure 55 is coupled to the first casing 110 and supports the heating part 30 and the upper bracket 40 disposed at positions not overlapping the printed circuit board 51 in the vertical direction in a state in which the first support structure 55 is coupled to the base bracket 50. As another embodiment, as described above, first support structure 55 may be disposed to be separated from base bracket 50. That is, breakage part 551 may be broken, and the first support structure 55 may be separated from the base bracket 50 and coupled to first casing 110 at a position spaced apart from the base bracket 50.

When the first support structure 55 is separated from the base bracket 50, the first support structure 55 may move to a position at which the first support structure 55 may stably support heating part 30 and upper bracket 40, may be coupled to the first casing 110, and in this state, may support weights of the heating part 30 and the upper bracket 40.

As illustrated in FIG. 23, the second support structure 56 may be fixed to the base bracket 50, and along with the first support structure 55, may support the heating part 30 and the upper bracket 40, which are disposed at positions not overlapping the printed circuit board 51 in the vertical direction. In this embodiment, as the first support structure 55 may be easily separated from the base bracket 50 and disposed at a proper position on the first casing 110 of the case 10 or removed therefrom, even in electric ranges in which shapes, sizes, and weights, for example, of heating parts 30 and upper brackets 40 are designed to be different, the heating part 30 and the upper bracket 40 may be stably supported using the first support structure 55, or a volumetric efficiency of the electric range may be improved by removing the first support structure 55 from the electric range.

In this embodiment, as the first support structure 55 is integrally manufactured with the base bracket 50, time, cost, and effort may be reduced when compared to a case in which a separate first support structure 55 is manufactured. Further, the second support structure 56 integrally manufactured and provided with the base bracket 50, along with the first support structure 55, may stably support the heating part 30 and the upper bracket 40.

Embodiments disclosed herein provide an electric range including a first support structure having a structure which corresponds to heating parts and upper brackets having various shapes, sizes, and weights, for example, and is capable of stably supporting the heating parts and the upper brackets. Further, embodiments disclosed herein provide an electric range including a second support structure which, along with a first support structure, supports a heating part and an upper bracket. Furthermore, embodiments disclosed herein provide an electric range in which a position of a first support structure is easily changed in the electric range.

Advantages are not limited to the above-described advantages, and other advantages may be understood from the description and clearly understood from embodiments. In addition, it may be seen that the advantages may be realized using elements described in the appended claims and combinations thereof.

Embodiments disclosed herein provide an electric range that may include a case, a cover plate coupled to an upper end of the case and having an upper surface on which a heating target is disposed, a heating part or heater disposed under the cover plate and configured to heat the heating target, an upper bracket which is disposed under the heating part and supports the heating part, a base bracket which is disposed under the upper bracket and on which a printed circuit board is installed, a heat sink installed on the printed circuit board, a blower fan installed on the base bracket and configured to discharge air toward the heat sink, and an air guide provided to communicate with the blower fan and to surround the heat sink to form a flow path of air which cools the heat sink. The air guide may include a first sidewall and a second sidewall, and the first sidewall and the second sidewall may form a flow space in which air flows.

The first sidewall may be provided as a pair of first sidewalls disposed at two sides of the heat sink. An upper wall may be provided to be coupled to upper ends of the pair of first sidewalls to cover the heat sink.

The air guide may include a first region, a second region, a third region, and a fourth region. The first region to the fourth region may be regions into which the flow space of the air formed in the air guide is divided.

The first region may communicate with the blower fan and guide air to flow in a lateral direction of the base bracket. In this case, the heat sink may be disposed in the first region. Air flowing into the air guide from the blower fan may pass through the first region of the air guide to flow to the heat sink and cool the heat sink.

The second region may be bent in a vertical direction of the base bracket and guide air to be discharged to the outside. The second region may be formed to face in a downward direction of the electric range to change a flow direction of the air flowing into the air guide.

That is, in the air guide, the upper wall may be bent downward in the second region to guide the air discharged from the second region to flow to a portion under the case.

Due to such structure, air discharged from the blower fan may flow into the air guide in a frontward-rearward direction of the electric range and discharged from the air guide in the downward direction of the electric range.

The third region may extend from the first region and change a flow direction of the air passing through the first region. In the air guide, the first sidewall may be bent to be inclined at an end portion of the first region to form the third region.

That is, the first sidewall may be formed to be inclined with respect to a frontward-rearward direction of the air guide in the third region of the air guide. Due to such structure, in the third region, air may flow in an inclined direction with respect to the frontward-rearward direction of the air guide.

The fourth region may extend from the third region, communicate with the second region, and change a flow direction of air passing through the third region. In the air guide, the first sidewall may be bent to be inclined at an end portion of the third region to form the fourth region.

That is, the first sidewall at an exit of the third region of the air guide may be formed to be inclined with respect to the first sidewall of the third region. Due to such structure, in the fourth region, the flow direction of the air of the air guide may be restored in the frontward-rearward direction of the air guide.

A longitudinal direction of the heat sink may be parallel to the flow direction of the air passing through the air guide. Due to such structure, a contact area and a contact time between the heat sink and air which is forcibly moved may be increased to improve cooling efficiency of the heat sink.

The heat sink may include a plurality of cooling fins. The plurality of cooling fins may be formed to protrude downward from a lower surface of the heat sink in the longitudinal direction of the heat sink.

The heat sink may include a flow pass formed to pass through the heat sink in the longitudinal direction to form a flow path of air. The flow pass may be formed in the longitudinal direction of the heat sink and formed to pass through a flat part or portion of the heat sink.

The heat sink may include inclined parts or portions disposed at two sides and having upper surfaces formed to be inclined and the flat part which is formed in a central portion of the heat sink, in which the flow pass is formed, and an upper surface of which is formed as a flat surface.

All or some heating elements included in the printed circuit board may be installed on the upper surfaces of the inclined parts. Accordingly, the air forcibly moved by the blower fan may cool the heating elements installed on the inclined parts of the heat sink to effectively suppress overheating of the printed circuit board.

The base bracket may include a first ventilation part or portion formed in a portion corresponding to the blower fan and a second ventilation part or portion formed in a portion corresponding to the fourth region. In this case, the first ventilation part may be formed in a shape corresponding to a shape of the blower fan, and the second ventilation part may be formed in a shape corresponding to a shape of the fourth region.

The case may include a first through port and a second through port in order to allow the air forcibly moved by the blower fan to effectively flow and be discharged.

The first through port may be formed in a portion corresponding to the first ventilation part, and the second through port may be formed in a portion corresponding to the second ventilation part. The first through port and the second through port may be formed by punching a first casing forming a bottom surface of the case.

The electric range according to an embodiment may include a first support structure. The first support structure may be disposed under the upper bracket and may support weights of the upper bracket and the heating part. The first support structure may be integrally manufactured with the base bracket and provided to be detachable from the base bracket.

The first support structure may include a breakage part or portion, a first support part or support, a first support protrusion, and a first coupling part or portion. The breakage part may be integrally manufactured with the base bracket and may be broken when the first support structure is separated from the base bracket. The breakage part may be formed in a thin bar shape to be easily broken and may also be provided as a plurality of breakage parts.

The first support part may be coupled to the breakage part and supported by the first casing forming the bottom surface of the case. The first support part may form a bottom of the first support structure, and the first support protrusion and the first coupling part may be formed on the first support part.

The first support protrusion may protrude upward from the first support part and support a lower surface of the upper bracket. The first support protrusion may include a first shell and a second shell.

The first shell may be provided to protrude upward from the first support part. The second shell may protrude from a side surface of the first shell and provided as a plurality of second shells radially disposed about the first shell. Upper end surfaces of the first shell and the second shell may be provided in contact with the lower surface of the upper bracket and support the upper bracket.

The first coupling part may protrude upward from the first support part and may be formed at a position spaced apart from the first support protrusion in a lateral direction, and a coupling unit coupled to the first casing may be formed on the first coupling part. A first coupling hole into which the coupling unit coupled to the first casing is inserted may be formed in the first coupling part.

The second support structure may protrude from an edge of the base bracket, may be formed at a position spaced apart from the first support structure, and may support weights of the upper bracket and the heating part. The second support structure may include a second support part or support, a second support protrusion, and a second coupling part or portion.

The second support protrusion may protrude upward from the second support part and support the lower surface of the upper bracket. The second support protrusion may include a first piece and a second piece.

The first piece may be provided to protrude upward from the second support part. The second piece may be provided to protrude from a side surface of the first piece, and a plurality of the second piece may be provided radially disposed about the first piece. Upper end surfaces of the first piece and the second piece may be provided in contact with the lower surface of the upper bracket and support the upper bracket.

The second coupling part may protrude upward from the second support part and may be formed at a position spaced apart from the second support protrusion. A coupling unit coupled to the first casing may be formed on the second coupling part.

Embodiments disclosed herein provide an electric range that may include a case, a cover plate coupled to an upper end of the case and having an upper surface on which a heating target is disposed, a heating part or heater disposed under the cover plate and configured to heat the heating target, an upper bracket which is disposed under the heating part and supports the heating part, a base bracket which is disposed under the upper bracket and on which a printed circuit board is installed, and a first support structure which is disposed under the upper bracket, supports weights of the upper bracket and the heating part, is integrally manufactured with the base bracket, and is provided to be detachable from the base bracket.

In an electric range according to embodiments disclosed herein, as a first support structure may be easily separated from a base bracket and disposed at a proper position on a first casing of a case or removed therefrom, even in electric ranges in which shapes, sizes, and weights, for example, of heating parts and upper brackets are designed to be different, the heating part and the upper bracket may be stably supported using the first support structure, or a volumetric efficiency of the electric range may be improved by removing the first support structure from the electric range. Further, in the electric range according to embodiments disclosed herein, as the first support structure is integrally manufactured with the base bracket, time, cost, and effort may be reduced when compared to a case in which a separate first support structure is manufactured. Furthermore, in the electric range according to embodiments disclosed herein, a second support structure integrally manufactured and provided with the base bracket, along with the first support structure, may stably support the heating part and the upper bracket.

Although embodiments have been described above with reference to the accompanying drawings, the embodiments are not limited by the embodiments and drawings illustrated in the present specification, and it is clear that the embodiments can be variously modified by those skilled in the art within a range of the technical spirit. In addition, although the operational effects according to the structure have not been clearly described in description of the embodiments, predictable effects according to the corresponding structure should also be recognized.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present invention.

Spatially relative terms, such as "lower", "upper" and the like, may be used herein for ease of description to describe the relationship of one element or feature to another element (s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electric range, comprising:

a case;

a plurality of heaters disposed in the case and configured to heat a heating target;

a plurality of upper brackets disposed under the plurality of heaters that supports the plurality of heaters, and including a first upper bracket and a second upper bracket;

a base bracket disposed under the first upper bracket and on which a printed circuit board is installed; and a first support structure that is disposed under the second upper bracket, supports weights of the second upper bracket and at least one heater of the plurality of heaters supported by the second upper bracket, is integrally manufactured with the base bracket, and is provided to be detachable from the base bracket, wherein the first upper bracket is supported by the base bracket, wherein the second upper bracket does not vertically overlap the printed circuit board and is supported by the first support structure, and wherein the first support structure includes:

a first support portion supported by a bottom surface of the case;

a first support protrusion that protrudes upward from the first support portion and supports a lower surface of the second upper bracket; and a breakable coupling bar configured to couple the first support portion with the base bracket and formed in a thin bar shape, wherein, in a state in which the breakable coupling bar is not broken, the first support portion is not separated from the base bracket and is disposed at a first position corresponding to the first support portion being coupled to the base bracket, and the first support protrusion supports the second upper bracket at the first position, and wherein, in another state in which the breakable coupling bar is broken, the first support portion is separated from the base bracket and is disposed at a second position different from the first position, and the first support protrusion supports the second upper bracket at the second position.

2. The electric range of claim 1, wherein the first support structure further includes:

a first coupling portion that protrudes upward from the first support portion and is spaced apart from the first support protrusion in a lateral direction, the first coupling portion being configured to couple to a first casing forming the bottom surface of the case.

3. The electric range of claim 2, wherein the first support protrusion includes:

a first shell that protrudes upward from the first support portion; and a plurality of second shells that protrudes from a side surface of the first shell and is radially disposed about the first shell.

4. The electric range of claim 3, wherein upper end surfaces of the first shell and the second shell are provided in contact with a lower surface of the second upper bracket and support the second upper bracket.

5. The electric range of claim 2, further comprising a second support structure that protrudes from an edge of the base bracket, is spaced apart from the first support structure, and supports weights of the second upper bracket and the at least one heater of the plurality of heaters.

6. The electric range of claim 5, wherein the second support structure includes:

a second support portion that protrudes from one side of the base bracket and is supported by the first casing;

a second support protrusion that protrudes upward from the second support portion and supports the lower surface of the second upper bracket; and a second coupling portion that protrudes upward from the second support portion and is spaced apart from the second support protrusion in the lateral direction, the second coupling portion being configured to couple to the first casing.

7. The electric range of claim 6, wherein the second support protrusion includes:

a first piece that protrudes upward from the second support portion; and a plurality of second pieces that protrudes from a side surface of the first piece and is radially disposed about the first piece.

8. The electric range of claim 7, wherein upper end surfaces of the first piece and the second piece are provided in contact with a lower surface of the second upper bracket and support the second upper bracket.

9. The electric range of claim 1, further comprising:

a heat sink installed on the printed circuit board;

a blower fan that is installed on the base bracket and discharges air toward the heat sink; and an air guide that communicates with the blower fan and surrounds the heat sink to form a flow path of air which cools the heat sink.

10. The electric range of claim 9, wherein the air guide includes:

a first region that communicates with the blower fan and guides air to flow in a lateral direction of the base bracket;

a second region that is bent in a vertical direction of the base bracket and guides air to be discharged outward;

a third region that extends from the first region and changes a flow direction of air passing through the first region; and a fourth region that extends from the third region, communicates with the second region, and changes a flow direction of air passing through the third region.

11. The electric range of claim 10, wherein the air guide includes:

a pair of first sidewalls disposed at two sides of the heat sink; and an upper wall provided to be coupled to upper ends of the pair of first sidewalls to cover the heat sink, wherein the third region is formed so that the first sidewall is bent to be inclined at an end portion of the first region, and the fourth region is formed so that the first sidewall is bent to be inclined at an end portion of the third region.

12. The electric range of claim 10, wherein the base bracket includes:

a first ventilation portion formed in a portion corresponding to the blower fan; and a second ventilation portion formed in a portion corresponding to the fourth region.

13. The electric range of claim 12, wherein the case includes:

a plurality of first through ports formed in a portion corresponding to the first ventilation portion; and a plurality of second through ports formed in a portion corresponding to the second ventilation portion.

14. An electric range, comprising:

a case;

a cover plate coupled to an upper end of the case and having an upper surface on which a heating target is disposed;

a plurality of heaters disposed under the cover plate and configured to heat the heating target;

a plurality of upper brackets disposed under the plurality of heaters that supports the plurality of heaters, and including a first upper bracket and a second upper bracket;

a base bracket that is disposed under the first upper bracket and on which a printed circuit board is installed; and a first support structure that is disposed under the second upper bracket, supports weights of the second upper bracket and at least one heater of the plurality of heaters supported by the second upper bracket, is integrally manufactured with the base bracket, and is provided to be detachable from the base bracket, wherein the first upper bracket is supported by the base bracket, wherein the second upper bracket does not vertically overlap the printed circuit board and is supported by the first support structure, and wherein the first support structure includes:

a first support portion supported by a bottom surface of the case;

a first support protrusion that protrudes upward from the first support portion and supports a lower surface of the second upper bracket; and a breakable coupling bar configured to couple the first support portion with the base bracket and formed in a thin bar shape, wherein, in a state in which the breakable coupling bar is not broken, the first support portion is not separated from the base bracket and is disposed at a first position corresponding to the first support portion being coupled to the base bracket, and the first support protrusion supports the second upper bracket at the first position, and wherein, in another state in which the breakable coupling bar is broken, the first support portion is separated from the base bracket and is disposed at a second position different from the first position, and the first support protrusion supports the second upper bracket at the second position.

15. The electric range of claim 14, wherein the first support structure further includes: a first support portion coupled to the breakage portion and supported by a first casing forming a bottom surface of the case, from which the first support protrusion protrudes upward; and a first coupling portion that protrudes upward from the first support portion and is spaced apart from the first support protrusion in a lateral direction, the first coupling portion being configured to couple to a first casing forming the bottom surface of the case.

* * * * *